(12) United States Patent
Baek et al.

(10) Patent No.: US 11,527,737 B2
(45) Date of Patent: Dec. 13, 2022

(54) ELECTRONIC DEVICE AND METHOD OF FORMING FLEXIBLE DISPLAY THEREOF

(71) Applicant: Samsung Electronics Co., Ltd., Gyeonggi-do (KR)

(72) Inventors: Moohyun Baek, Gyeonggi-do (KR); Jaeyoung Shin, Gyeonggi-do (KR); Youngsoo Chun, Gyeonggi-do (KR); Seungmin Choi, Gyeonggi-do (KR); Byounguk Yoon, Gyeonggi-do (KR); Soyoung Lee, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/156,672

(22) Filed: Jan. 25, 2021

(65) Prior Publication Data

US 2021/0143362 A1   May 13, 2021

Related U.S. Application Data

(63) Continuation of application No. 16/353,265, filed on Mar. 14, 2019, now Pat. No. 10,903,445.

(30) Foreign Application Priority Data

Mar. 26, 2018   (KR) ........................ 10-2018-0034641

(51) Int. Cl.
*H01L 51/00*   (2006.01)
*H01L 27/32*   (2006.01)
(Continued)

(52) U.S. Cl.
CPC .......... *H01L 51/5237* (2013.01); *G06F 3/041* (2013.01); *H01L 27/323* (2013.01);
(Continued)

(58) Field of Classification Search
CPC ............... H01L 51/5237; H01L 27/323; H01L 51/0097; G06F 3/041; G06F 2203/04102;
(Continued)

(56) References Cited

U.S. PATENT DOCUMENTS 10,561,027 B2 * 2/2020 Kim ........................ H04M 1/18
10,903,445 B2 * 1/2021 Baek ....................... G06F 3/041
(Continued)

FOREIGN PATENT DOCUMENTS

CN       104933970 A    9/2015
CN       105976718 A    9/2016
(Continued)

OTHER PUBLICATIONS

European Search Report dated Feb. 15, 2021.

*Primary Examiner* — Mihir K Rayan
(74) *Attorney, Agent, or Firm* — Cha & Reiter, LLC

(57) ABSTRACT

An electronic device includes a housing including a recess; an internal structure disposed in the recess; and a display disposed in the recess and supported by the internal structure, where the display includes a display panel including a first region and a second region, where the second region forms at least part of an edge of the display panel; and a flexible polymer layer forming an outer surface of the display panel, where the flexible polymer layer includes a first portion covering the first region and the second region, and a second portion extending from the first portion, enclosing the at least part of the edge of the display panel, and extending inward. Thereby, foreign material can be prevented from entering into the display. Various other embodiments are possible.

16 Claims, 22 Drawing Sheets

(51) Int. Cl.
*G06F 1/16* (2006.01)
*H04M 1/02* (2006.01)
*H01L 51/52* (2006.01)
*G06F 3/041* (2006.01)

(52) U.S. Cl.
CPC ........ H01L 51/0097 (2013.01); *G06F 1/1652* (2013.01); *G06F 2203/04102* (2013.01); *G06F 2203/04108* (2013.01); *H04M 1/0268* (2013.01)

(58) Field of Classification Search
CPC ........ G06F 2203/04108; G06F 1/1652; H04M 1/0268; Y02E 10/549
See application file for complete search history.

(56) References Cited

U.S. PATENT DOCUMENTS

| | | | |
|---|---|---|---|
| 2011/0050657 A1 | 3/2011 | Yamada | |
| 2013/0002572 A1 | 1/2013 | Jin et al. | |
| 2013/0211971 A1* | 8/2013 | Lin | G06Q 30/06 705/27.1 |
| 2013/0279088 A1* | 10/2013 | Raff | G06F 1/1601 361/679.01 |
| 2013/0342429 A1* | 12/2013 | Choi | G06F 1/1652 29/846 |
| 2014/0104762 A1 | 4/2014 | Park | |
| 2014/0118269 A1* | 5/2014 | Kim | G06F 3/0445 361/679.01 |
| 2014/0126133 A1 | 5/2014 | Griffin et al. | |
| 2014/0132488 A1* | 5/2014 | Kim | G06F 1/1637 345/76 |
| 2014/0168090 A1 | 6/2014 | Aaltonen et al. | |
| 2014/0198436 A1 | 7/2014 | Lim et al. | |
| 2014/0217382 A1 | 8/2014 | Kwon et al. | |
| 2014/0293573 A1 | 10/2014 | Kang | |
| 2014/0355227 A1* | 12/2014 | Lim | G02F 1/133305 361/749 |
| 2015/0043142 A1* | 2/2015 | Jang | G06F 1/1601 361/679.26 |
| 2015/0160699 A1* | 6/2015 | Choi | H04M 1/0266 345/173 |
| 2016/0062391 A1 | 3/2016 | Choi et al. | |
| 2016/0066440 A1 | 3/2016 | Choi et al. | |
| 2017/0064847 A1 | 3/2017 | Lim | |
| 2017/0098794 A1 | 4/2017 | Cho et al. | |
| 2017/0126865 A1 | 5/2017 | Lee | |
| 2017/0140504 A1 | 5/2017 | Jeong et al. | |
| 2017/0199544 A1 | 7/2017 | Choi et al. | |
| 2017/0263891 A1 | 9/2017 | Oh et al. | |
| 2018/0249584 A1* | 8/2018 | Kim | G09G 3/20 |
| 2018/0364760 A1 | 12/2018 | Ahn et al. | |

FOREIGN PATENT DOCUMENTS

| | | |
|---|---|---|
| EP | 3 382 496 A1 | 10/2018 |
| KR | 10-2014-0117999 A | 10/2014 |
| KR | 10-2015-0065415 A | 6/2015 |
| WO | 2017-095167 A1 | 6/2017 |

* cited by examiner

ELECTRONIC DEVICE AND METHOD OF FORMING FLEXIBLE DISPLAY THEREOF

CROSS-REFERENCE TO RELATED APPLICATION(S)

This application is a Continuation of U.S. patent application Ser. No. 16/353,265 filed on Mar. 14, 2019 which claims priority under 35 U.S.C. § 119 to Korean Patent Application No. 10-2018-0034641, filed on Mar. 26, 2018, in the Korean Intellectual Property Office, the disclosure of which is incorporated by reference herein in its entirety.

BACKGROUND

Field

Certain embodiments of the present disclosure generally relate to an electronic device and a method of forming a flexible display therein.

Description of the Related Art

Electronic devices may display a large amount of information through their displays. As technology develops, the size of the display in an electronic device has gradually increased, and the bezel region around the outer portion of the display has become increasingly thinner. The electronic device may partially bend an outer portion of the display (e.g. left and right edges) such that the area occupied by the display in the front portion of the electronic device is enlarged. A display having a bent outer portion may be a flexible display (e.g., edge display). The electronic device may employ a flexible display based on aesthetic and functional considerations.

The display of the electronic device may be implemented as a structure in which a plurality of panels are stacked. The flexible display may be formed by partially bending the plurality of stacked panels by applying a force. When the force is removed, the plurality of panels may be restored to their original shape. This phenomenon of being restored back to their original shape may be referred to as the spring back phenomenon.

SUMMARY

In one embodiment, the present disclosure provides an electronic device including a flexible display in which a window at least partially enclosing the flexible display is attached to one surface of the flexible display in order to prevent the phenomenon (e.g., spring back phenomenon) that restores the original shape of at least one bent panel.

In one or more embodiments, the present disclosure further provides an electronic device capable of forming a curved surface structure of a flexible display in order to prevent the spring back phenomenon of at least one panel.

In accordance with an aspect of the present disclosure, an electronic device includes a housing including a recess; an internal structure disposed in the recess; and a display disposed in the recess and supported by the internal structure, wherein the display includes a display panel including a first region and a second region, wherein the second region forms at least part of an edge of the display panel; and a flexible polymer layer forming an outer surface of the display panel, wherein the flexible polymer layer includes a first portion covering the first region and the second region, and a second portion extending from the first portion, enclosing the at least part of the edge of the display panel, and extending inward.

In accordance with another aspect of the present disclosure, an electronic device including a bent display also includes a bending structure disposed at one end of the display; and an internal structure disposed on one surface of the display. The display may be bent by the bending structure and be supported by the internal structure, and the display includes a display panel including a first region and a second region, wherein the second region forms at least part of an edge of the display panel; and a flexible polymer layer configured to form an outer surface of the display panel, wherein the flexible polymer layer includes a first portion enclosing the first region and the second region of the display panel and a second portion extending from the first portion, enclosing an edge of the display panel and at least part of the bending structure, and extending inward.

BRIEF DESCRIPTION OF THE DRAWINGS

The above and other aspects, features, and advantages of the present disclosure will be more apparent from the following detailed description in conjunction with the accompanying drawings, in which.

DETAILED DESCRIPTION OF EMBODIMENTS

Figure 1:
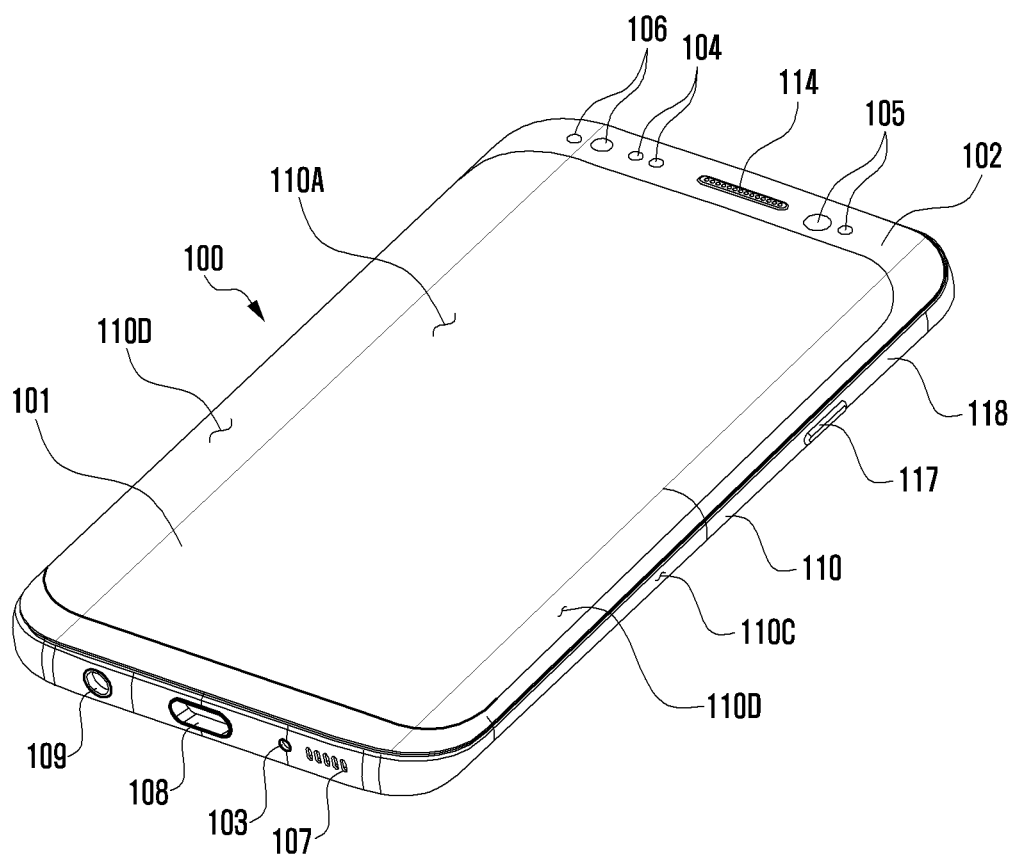
FIG. 1 is a perspective view illustrating a front surface of a mobile electronic device according to an embodiment.

Hereinafter, the present disclosure is described with reference to the accompanying drawings. Although various example embodiments are illustrated in the drawings and related detailed descriptions are discussed in the disclosure, the present disclosure may have various modifications and several embodiments. However, certain embodiments of the present disclosure are not limited to a specific implementation form and it should be understood that the present disclosure includes all changes and/or equivalents and substitutes included in the certain embodiments of the present disclosure. In connection with descriptions of the drawings, similar components are designated by the same reference numeral.

In certain embodiments of the present disclosure, the terms such as "include," "have," "may include," or "may have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

In certain embodiments of the present disclosure, the expression "or" or "at least one of A or/and B" includes any or all of combinations of words listed together. For example, the expression "A or B" or "at least A or/and B" may include A, may include B, or may include both A and B.

The expression "1," "2," "first," or "second" used in certain embodiments of the present disclosure may be used for various components of the certain embodiments but does not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

When it is stated that a component is "(operatively or communicatively) coupled to" or "connected to" another component, the component may be directly coupled or connected to another component or a new component may exist between the component and another component. On the other hand, when it is stated that a component is "directly coupled to" or "directly connected to" another component, a new component does not exist between the component and another component.

In the present disclosure, the expression "configured (or set) to do" may be used interchangeably with, for example, "suitable for doing," "having the capacity to do," "designed to do," "adapted to do," "made to do," or "capable of doing." The expression "configured (or set) to do" may not necessarily be used to refer to only something in hardware for which it is "specifically designed to do." Instead, the expression "a device configured to do" may indicate that the device is "capable of doing" something with other devices or parts. For example, the expression "a processor configured (or set) to do A, B and C" may refer to a dedicated processor (e.g., an embedded processor) or a generic-purpose processor (e.g., CPU or application processor or any other processing circuitry) that may execute one or more software programs stored in a memory device to perform corresponding functions.

According to certain embodiments, examples of the electronic device may include a smartphone, a tablet Personal Computer (PC), a mobile phone, a video phone, an electronic book reader, a desktop PC, a laptop PC, a netbook computer, a workstation, a server, a Personal Digital Assistant (PDA), a Portable Multimedia Player (PMP), an MP3 player, a medical device, a camera, and a wearable device, or the like, but is not limited thereto. Examples of the wearable device may include an accessory type device (such as, watch, ring, bracelet, ankle bracelet, necklace, glasses, contact lens, and Head-Mount Device (HMD)), a textile or clothes type device (such as electronic clothes), a body-attached type (such as skin pad and tattoo), and a bio-implemented type, or the like, but is not limited thereto.

According to an embodiment, examples of the electronic device may include a television, a Digital Video Disc (DVD) player, an audio player, a refrigerator, an air conditioner, a cleaner, an oven, a microwave oven, a laundry machine, an air purifier, a set-top box, a home automation control panel, a security control panel, a media box (such as Samsung HomeSync™, apple TV™, and google TV™), a game console (such as Xbox™ and PlayStation™), an electronic dictionary, an electronic key, a camcorder, and an electronic frame, or the like, but is not limited thereto.

According to an embodiment, examples of the electronic device may include a medical device (such as portable medical sensors (including glucometer, heart rate sensor, tonometer, and body thermometer), Magnetic Resonance Angiography (MRA) device, Magnetic Resonance Imaging (MRI) device, Computed Tomography (CT) device, camcorder, and microwave scanner), a navigation device, a Global navigation Satellite System (GNSS), an Event Data Recorder (EDR), a Flight Data Recorder (FDR), an automotive infotainment device, marine electronic equipment (such as marine navigation system and gyro compass), aviation electronics (avionics), an automotive head unit, an industrial or household robot, an Automatic Teller Machine (ATM), a Point Of Sales (POS) terminal, and an Internet-of-Things (IoT) device (such as electric bulb, sensor, sprinkler system, fire alarm system, temperature controller, street lamp, toaster, fitness equipment, hot water tank, heater, and boiler), or the like, but is not limited thereto.

According to an embodiment, examples of the electronic device may include furniture, a building/structure, a part of a vehicle, an electronic board, an electronic signature receiving device, a projector, and a sensor (such as water, electricity, gas, and electric wave meters), or the like, but is not limited thereto. According to certain embodiments, the electronic device may be flexible or a combination of at least two of the aforementioned devices. According to an embodiment, the electronic device is not limited to the aforementioned devices.

In the disclosure, the term "user" may denote a person who uses the electronic device or a device (e.g., artificial intelligent electronic device) which uses the electronic device.

Figure 2:
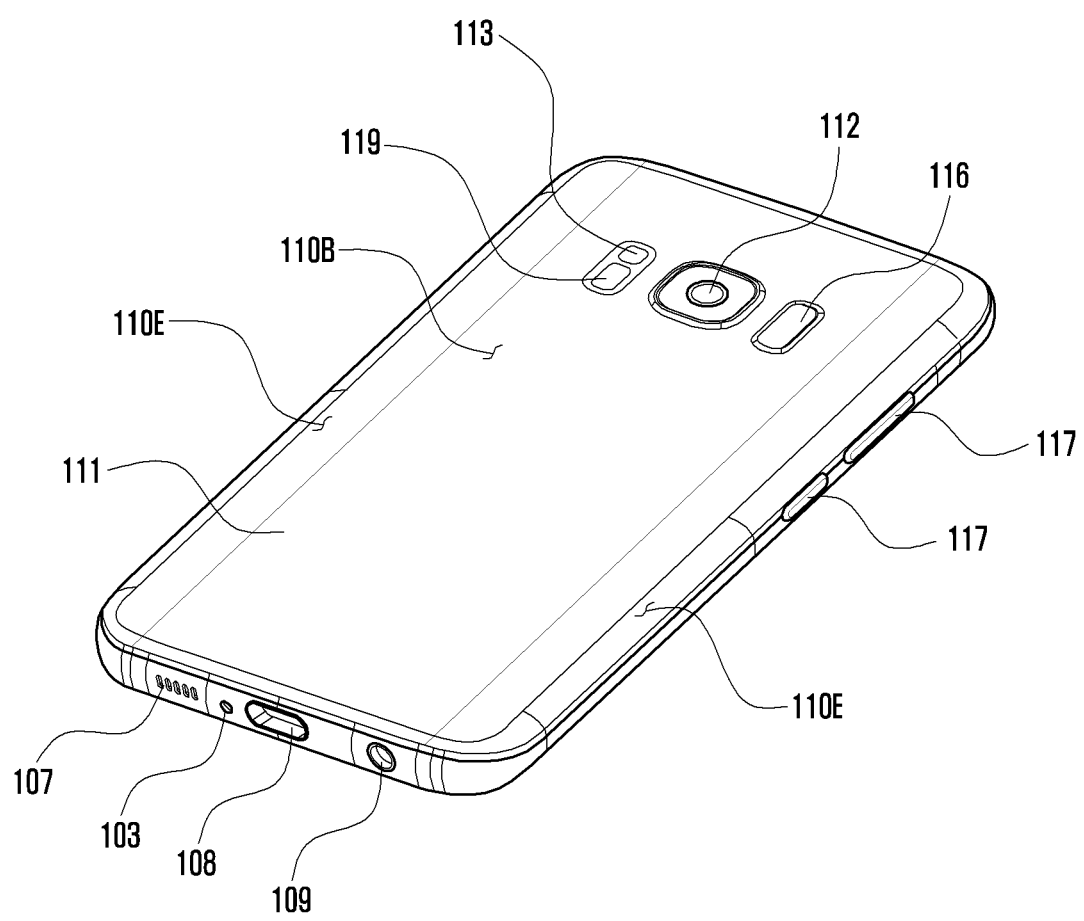
FIG. 2 is a perspective view illustrating a rear surface of the electronic device of FIG. 1.

FIG. 1 is a perspective view illustrating a front surface of a mobile electronic device according to an embodiment, and FIG. 2 is a perspective view illustrating a rear surface of the electronic device of FIG. 1.

With reference to FIGS. 1 and 2, an electronic device 100 according to an embodiment may include a housing 110 including a first surface (or front surface) 110A, a second surface (or rear surface) 110B, and a side surface 110C enclosing a space between the first surface 110A and the second surface 110B. In another embodiment (not illustrated), the housing 110 may refer to a structure made up of part of the first surface 110A, second surface 110B, and side surface 110C of FIG. 1. According to an embodiment, the first surface 110A may be formed by a front plate 102 (e.g., a polymer plate or a glass plate including various coating layers) of which at least part is substantially transparent. The second surface 110B may be formed by a substantially opaque rear plate 111. The rear plate 111 may be made of, for example, coating or colored glass, ceramic, polymer, metal (e.g., aluminum, stainless steel (STS), or magnesium) or a combination of at least two of these materials. The side surface 110C may be coupled to the front plate 102 and the rear plate 111 and be formed by a side bezel structure (or "side member") 118 including metal and/or polymer. In some embodiments, the rear plate 111 and the side bezel structure 118 may be integrally formed and be made of the same material (e.g., metal such as aluminum).

In an illustrated embodiment, the front plate 102 may include two first regions 110D bent from the first surface 110A toward the rear plate 111 and seamlessly extending the long edges (e.g. left and right edges) of the first surface 110A. In the illustrated embodiment (see FIG. 2), the rear plate 111 may include two second regions 110E bent from the second surface 110B toward the front plate 102 and seamlessly extending the long edges (e.g. left and right edges) of the second surface 110B. In some embodiments, the front plate 102 (or the rear plate 111) may include only one of the first regions 110D (or the second regions 110E). In other embodiments, some of the first regions 110D or the second regions 110E may not be included. In the above embodiments, when viewed from the side surface of the electronic device 100, the side bezel structure 118 may have a first thickness (or width) at the side surface where the first regions 110D and/or the second regions 110E are absent (e.g. at the side surface towards the top and bottom of the electronic device. The side bezel structure 118 may further have a smaller second thickness smaller at the side surface where the first regions 110D and/or the second regions 110E are present.

According to an embodiment, the electronic device 100 may include at least one of a display 101, audio modules 103, 107 and 114, sensor modules 104, 116 and 119, camera modules 105, 112 and 113, key input device 117, light emitting device 106, and connector holes 108 and 109. In some embodiments, the electronic device 100 may omit at least one (e.g., the key input device 117 or the light emitting device 106) of the components or may additionally include other components.

The display 101 may be exposed, for example, through the substantially transparent portion of the front plate 102. In some embodiments, at least part of the display 101 may be exposed through the front plate 102 forming the first region 110D and the first surface 110A. In some embodiments, edges of the display 101 may be formed to have substantially the same shape as the adjacent outer shape of the front plate 102. In another embodiment (not illustrated), in order to enlarge an exposure area of the display 101, a distance between an outer portion of the display 101 and an outer portion of the front plate 102 may be substantially the same.

The display 101 may be a flexible display. According to an embodiment, the flexible display may be a display where at least part of the display 101 may be bent. For example, the flexible display may have a flat central portion and a bent side surface. By virtue of the bent side surface of the display, the electronic device 100 having the flexible display may have the advantage of having a thin side bezel. Accordingly, the electronic device 100 having the flexible display may have an aesthetically pleasing external appearance.

In another embodiment (not illustrated), in a part of a screen display area of the display 101, a recess or an opening may be formed, and at least one of the audio module 114, sensor module 104, camera module 105, and light emitting device 106 may be included in the recess or the opening. In yet another embodiment (not illustrated), at least one of the audio module 114, the sensor module 104, the camera module 105, a fingerprint sensor 116, and the light emitting device 106 may be disposed behind the screen display area of the display 101. In another embodiment (not illustrated), the display 101 may be coupled to a touch sensing circuit, a pressure sensor capable of measuring intensity (e.g. pressure) of a touch, and/or a digitizer for detecting a the magnetic field of a stylus pen. In some embodiments, at least part of the sensor modules 104 and 119 and/or at least part of the key input device 117 may be disposed in the first regions 110D and/or the second regions 110E.

The audio modules 103, 107, and 114 may include a microphone hole 103 and speaker holes 107 and 114. The microphone hole 103 may provide outlet for a microphone that detects sound from outside the electronic device, and in some embodiments, a plurality of microphones may be disposed. The speaker holes 107 and 114 may include an external speaker hole 107 and a communication receiver hole 114. In some embodiments, the speaker holes 107 and 114 and the microphone hole 103 may be implemented into a single hole, or a speaker (e.g., piezo speaker) may be included without the speaker holes 107 and 114.

The sensor modules 104, 116, and 119 may generate electrical signals or data values corresponding to operating states inside the electronic device 100 or external environment states. The sensor modules 104, 116, and 119 may include, for example, a first sensor module 104 (e.g., a proximity sensor) and/or a second sensor module (not illustrated) (e.g., a fingerprint sensor) disposed on the first surface 110A of the housing 110. The sensor modules 104, 116, and 119 may further include a third sensor module 119 (e.g., heart rate monitor (FIRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., under the display 101) of the housing 110. The electronic device 100 may further include other sensor modules, such as at least one of gesture sensor, gyro sensor, atmospheric pressure sensor, magnetic sensor, acceleration sensor, grip sensor, color sensor, infrared (IR) sensor, biometric sensor, temperature sensor, humidity sensor, or illuminance sensor 104.

The camera modules 105, 112, and 113 may include a first camera device 105 disposed on the first surface 110A of the electronic device 100 and a second camera device 112 disposed on the second surface 110B, and/or a flash 113. The camera devices 105 and 112 may include one or more lenses, image sensors, and/or image signal processors. The flash 113 may include, for example, a light emitting diode or a xenon lamp. In some embodiments, two or more lenses (infrared camera, wide angle and telephoto lens) and image sensors may be disposed on one surface of the electronic device 100.

The key input device 117 may be disposed on the side surface 110C of the housing 110. In another embodiment, the electronic device 100 may not include a hardware key input device 117 as shown in FIGS. 1 and 2, and the key input device 117 may be implemented as a soft key displayed on the display 101. In some embodiments, the key input device 117 may include a sensor module 116 disposed on the second surface 110B of the housing 110.

The light emitting device 106 may be disposed, for example, on the first surface 110A of the housing 110. The light emitting device 106 may optically provide, for example, status information of the electronic device 100. In another embodiment, the light emitting device 106 may provide a light source for the camera module 105 (e.g. as a flash for the camera module 105). The light emitting device 106 may be, for example, a light emitting diode (LED), an infrared (IR) LED, and a xenon lamp.

The connector holes 108 and 109 may include a first connector hole 108 that may receive a connector (e.g., a universal serial bus (USB) connector) for transmitting and receiving power and/or data to and from an external electronic device and/or a second connector hole (e.g., an earphone jack) 109 that may receive a connector for transmitting and receiving an audio signal to and from an external electronic device.

Figure 3:
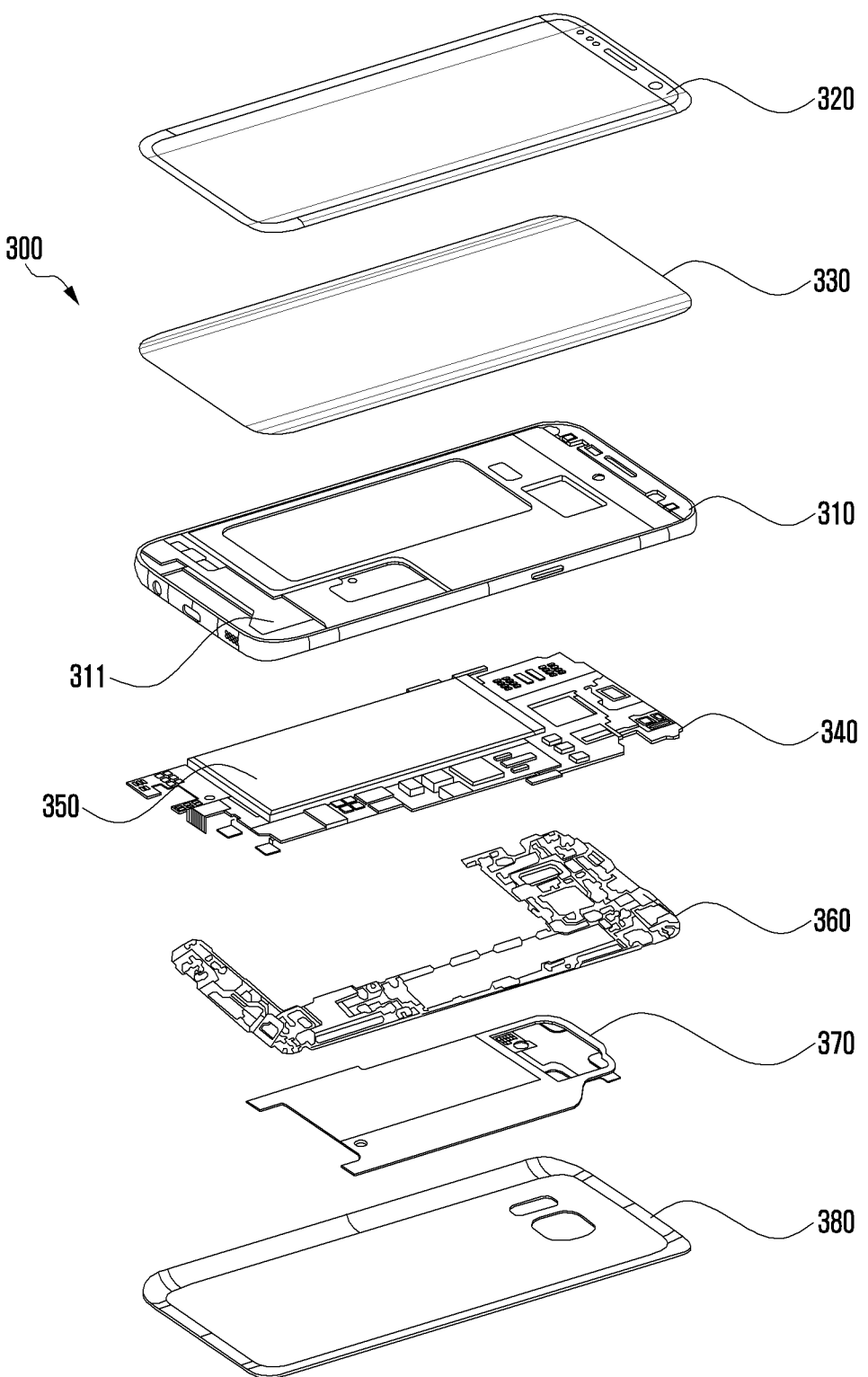
FIG. 3 is an exploded perspective view illustrating the electronic device of FIG. 1.

FIG. 3 is an exploded perspective view illustrating the electronic device of FIG. 1.

With reference to FIG. 3, an electronic device 300 may include a side bezel structure 310, first support member 311 (e.g., bracket), front plate 320, display 330, printed circuit board 340, battery 350, second support member 360 (e.g., rear case), antenna 370, and rear plate 380. In some embodiments, the electronic device 300 may omit at least one (e.g., the first support member 311 or the second support member 360) of the components or may further include other components. Some of the components of the electronic device 300 may be the same as or similar to corresponding components of the electronic device 100 of FIG. 1 or 2, and redundant descriptions thereof are omitted hereinafter.

The first support member 311 may be disposed inside the electronic device 300 to be connected to the side bezel structure 310 or may be formed integrally with the side bezel structure 310. The first support member 311 may be made of, for example, a metal material and/or a non-metal (e.g., polymer) material. A display 330 may be coupled to one surface of the first support member 311, and a printed circuit board 340 may be coupled to the other surface of the first support member 311. On the printed circuit board 340, a processor, memory, and/or interface may be mounted. The processor may include, for example, at least one of a central processing unit, application processor, graphic processing unit, image signal processor, sensor hub processor, or communication processor.

According to an embodiment, the front plate 320 may include a window (e.g., a film, tempered glass) for protecting the internal components of the electronic device 300.

According to an embodiment, the display 330 may be implemented as a series of stacked panels. The panels may include a touch sensitive panel and an organic light emitting layer and be flexible. The window of the front plate 320 may be attached to one surface (e.g. upper surface) of the flexible display. For example, the window may be a member for protecting the panels included in the flexible display from external impact. According to an embodiment, the window may be partially bent along the edges (e.g. the longer left and right edges). The present disclosure does not restrict the shape of the window and it may be made of an easily bendable material. For example, the window may be made of a material such as polyimide (PI), polycarbonate (PC), polyether sulfone (PES), polyethylene terephthalate (PET), polyethylene naphthalate (PEN), and glass fiber reinforced plastic (FRP).

According to an embodiment, an electronic device having a flexible display may have the effect of making the side bezel structure 310 visually thin.

The memory may include, for example, a volatile memory or a non-volatile memory.

The interface may include, for example, a high definition multimedia interface (HDMI), universal serial bus (USB) interface, secure digital (SD) card interface, and/or audio interface. The interface may, for example, electrically or physically connect the electronic device 300 with an external electronic device and may include a USB connector, an SD card/multi-media card (MMC) connector, or an audio connector.

The battery 350 is a device for supplying power to at least one component of the electronic device 300 and may include, for example, a non-rechargeable primary battery, a rechargeable secondary battery, or a fuel cell. At least part of the battery 350 may be disposed, for example, substantially flush with the printed circuit board 340. The battery 350 may be integrally disposed within the electronic device 300 and be detachably disposed from the electronic device 300.

The antenna 370 may be disposed between the rear plate 380 and the battery 350. The antenna 370 may include, for example, a near field communication (NFC) antenna, wireless charging antenna, and/or magnetic secure transmission (MST) antenna. The antenna 370 may perform, for example, short-range communication with an external device or may transmit and receive wirelessly power necessary for charging. In other embodiments, the antenna structure may be formed by part of the first support member 311 and/or the side bezel structure 310 or a combination thereof.

Figure 4:
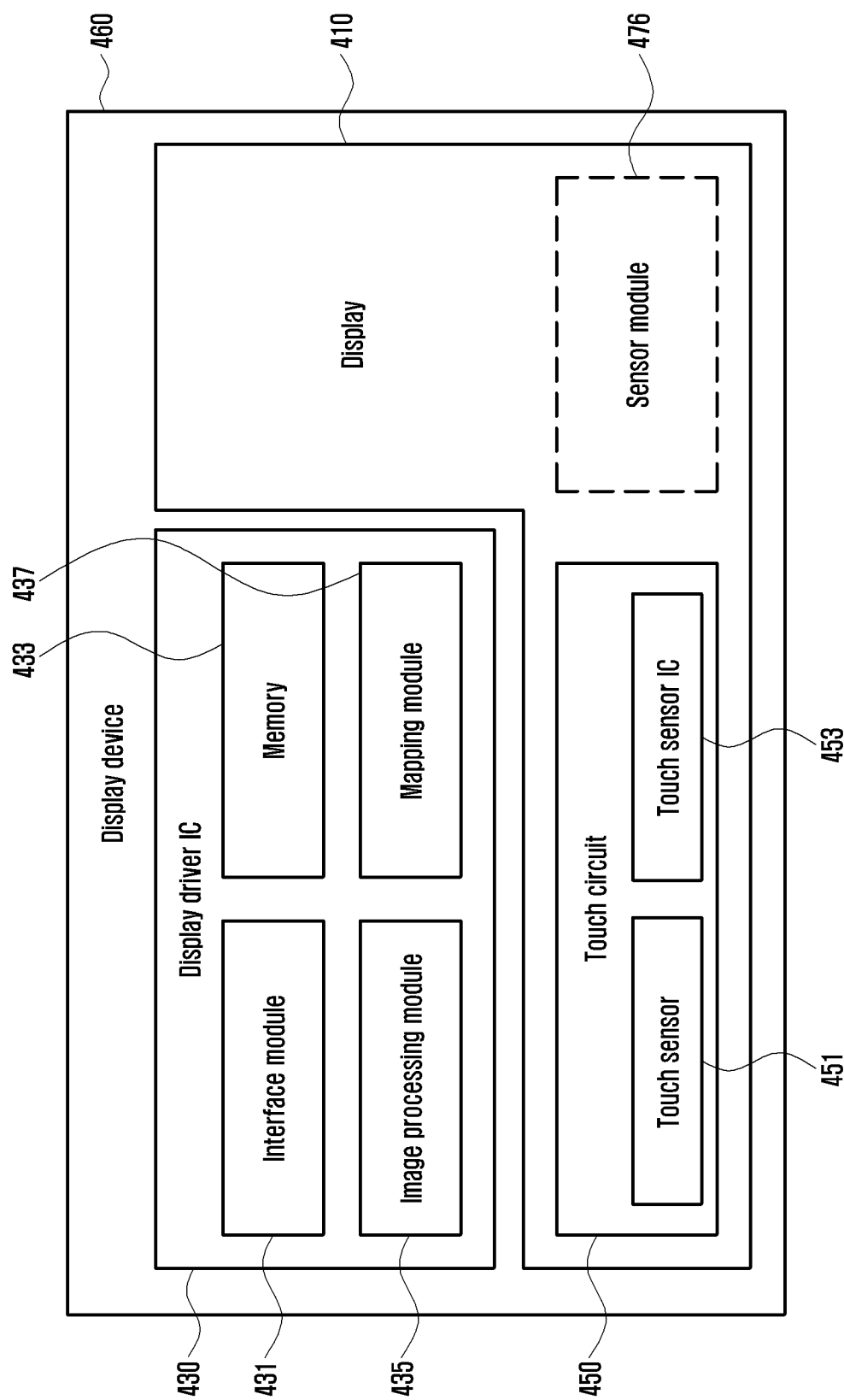
FIG. 4 is a block diagram illustrating a configuration of a display device according to an embodiment.

FIG. 4 is a block diagram illustrating a display device 460 according to an embodiment.

With reference FIG. 4, the display device 460 may include a display 410 and a display driver IC (DDI) 430 for controlling the display 410. The DDI 430 may include an interface module 431, memory 433 (e.g., a buffer memory), image processing module 435, or mapping module 437. The DDI 430 may receive, for example, image data or image information including an image control signal corresponding to a command for controlling the image data from another component of an electronic device through the interface module 431. For example, according to an embodiment, the image information may be received from a processor (e.g., a main processor) (e.g., an application processor) or an auxiliary processor (e.g., graphic processing device) operated independently of a function of the main processor. The DDI 430 may communicate with a touch circuit 450 or a sensor module 476 through the interface module 431. Further, the DDI 430 may store at least part of the received image information in, for example, a frame unit in the memory 433. The image processing module 435 may perform, for example, a pre-processing or a post-processing (e.g., resolution, brightness, and size adjustment) of at least some of the image data based on at least part of characteristics of image data or characteristics of the display 410. The mapping module 437 may generate a voltage value or a current value corresponding to the pre-processed or post-processed image data through the image processing module 435. According to an embodiment, a voltage value or a current value may be generated based on, for example, at least some of properties of pixels (e.g., array of pixels (RGB stripe or pentile structure or size of each of subpixels) of the display 410. As at least some of pixels of the display 410 are driven, for example, based on at least part of the voltage value or current value, visual information (e.g., text, image, icon) corresponding to the image data may be displayed through the display 410.

According to an embodiment, the display device 460 may further include a touch circuit 450. The touch circuit 450 may include a touch sensor 451 and a touch sensor IC 453 for controlling the touch sensor 451. The touch sensor IC 453 may control the touch sensor 451, for example, in order to detect a touch input or a hovering input to a specific position of the display 410. For example, the touch sensor IC 453 may measure a change of a signal (e.g., voltage, light quantity, resistance, or charge quantity) to a specific position of the display 410 to detect a touch input or a hovering input. The touch sensor IC 453 may provide information (e.g., position, area, pressure, or time) about the detected touch input or hovering input to the processor. According to an embodiment, at least a portion (e.g., the touch sensor IC 453)

of the touch circuit 450 may be included as part of the DDI 430 or the display 410 or as part of another component (e.g., auxiliary processor) disposed outside the display device 460.

According to an embodiment, the display device 460 may further include at least one sensor (e.g., a fingerprint sensor, iris sensor, pressure sensor, or illuminance sensor) of the sensor module 476 or a control circuit therefor. In this case, the at least one sensor or the control circuit thereof may be embedded in a portion (e.g., the display 410 or the DDI 430) of the display device 460 or a portion of the touch circuit 450. For example, when the sensor module 476 embedded in the display device 460 includes a biometric sensor (e.g., a fingerprint sensor), the biometric sensor may obtain biometric information (e.g., a fingerprint image) related to a touch input through some area of the display 410. As another example, when the sensor module 476 embedded in the display device 460 includes a pressure sensor, the pressure sensor may obtain pressure information related to a touch input through some area or an entire area of the display 410. According to an embodiment, the touch sensor 451 or the sensor module 476 may be disposed between pixels of a pixel layer of the display 410 or above or below the pixel layer.

Figure 5:
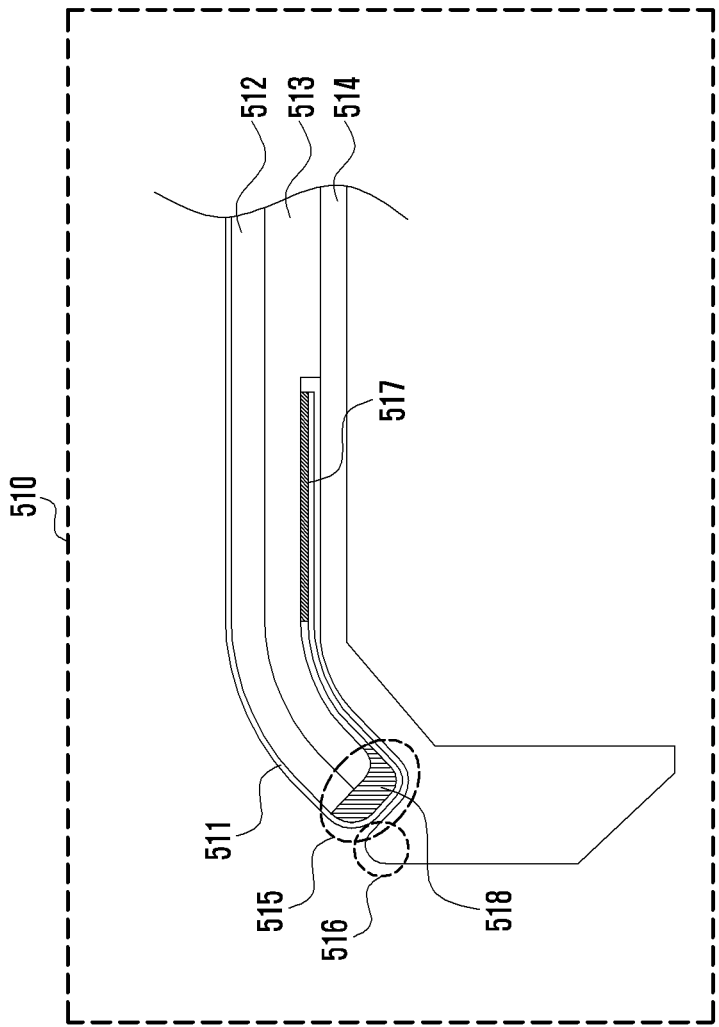
FIG. 5 is a cross-sectional view illustrating a flexible display and a display support member according to an embodiment.
Figure 5:
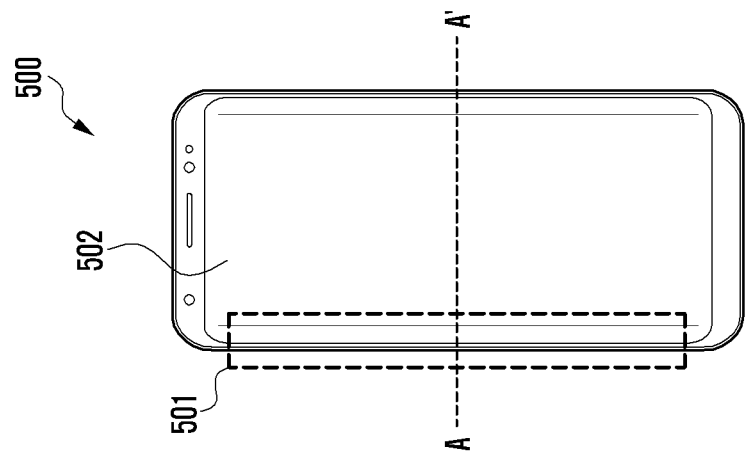

FIG. 5 is a cross-sectional view illustrating a flexible display and a display support member according to an embodiment.

With reference to FIG. 5, in an electronic device 500 (e.g., the electronic device 100 of FIG. 1), a flexible display 502 may be mounted, and the electronic device 500 may display various screens or content through the flexible display 502. The flexible display 502 may include at least one panel (e.g., the panels included in the display 330 of FIG. 3), and at least one end 501 thereof may be bent. According to an embodiment, the other end opposite the one end 501 of the flexible display 502 may also be bent. The shape of the flexible display 502 may be formed to correspond to the shape of a component disposed at the periphery of the display support member 513 (e.g., a bracket) that supports the panel.

A cross-sectional view 510 of FIG. 5 illustrates the electronic device 500 taken along line A-A'.

With reference to the cross-sectional view 510, a flexible display 512 may be disposed between a window 511 and the display support member 513. For example, the window 511 may be a film for protecting the flexible display 512. For example, the window 511 may be a protective film made of at least one of polyimide (PI), polycarbonate (PC), polyether sulfone (PES), polyethylene terephthalate (PET), polyethylene naphthalate (PEN), and glass fiber reinforced plastic (FRP). The window 511 according to certain embodiments is not limited to the above-mentioned materials.

The display support member 513 may be made of a metal, an injection product, or a film and may be an additional plate attached to the lower portion of the flexible display 512. According to an embodiment, the display support member 513 may be seated in a first support member 514 (e.g., the first support member 311 of FIG. 3). The window 511, the flexible display 512, and the display support member 513 may be stacked, and the shape of the display support member 513 may determine the shape of the flexible display 512. The window 511 may be at least partially attached to an upper portion (e.g., one side) of the flexible display 512, and the display support member 513 may be at least partially attached to a lower portion (e.g., the side opposite the one side) of the flexible display 512.

According to an embodiment, the window 511 may be at least partially attached to the display support member 513 so that the window 511 at least partly encloses the flexible display 512 and the display support member 513 in order to prevent the spring back phenomenon of the flexible display 512.

According to an embodiment, when the window 511 does not enclose the flexible display 512 and the display support member 513, the spring back phenomenon may occur in the flexible display 512, which may damage the electronic device. For example, when the spring back phenomenon occurs, the stacked structure between the flexible display 512 and the display support member 513 may be exposed to the outside of the electronic device. Further, peeling may occur in which at least some of the layers forming the flexible display 512 are separated. A gap (e.g., separated space) may occur between the housing enclosing the window 511, the flexible display 512, and the display support member 513, and when a sharp material such as a nail enters into the generated gap, the window 511 and the flexible display 512 may be damaged. Foreign materials (e.g., fine dust, moisture) may also enter into the generated gap, causing additional damages to the window 511, the flexible display 512, and/or the display support member 513.

According to an embodiment, the window 511 may be at least partially attached to the flexible display 512 and the display support member 513 in a form that at least partially encloses the flexible display 512 and the display support member 513. According to an embodiment, the window 511 partially enclose a lower portion of the display support member 513 and the flexible display 512 in order to prevent the spring back phenomenon of the flexible display 512. For example, the window 511 may be inserted between the flexible display 512 and the display support member 513 to be partially attached to the lower portion of the flexible display 512. As another example, the window 511 may be partially attached to the lower portion of the display support member 513 so as to enclose the flexible display 512 and the display support member 513.

According to an embodiment, the window 511 may be partially attached to the lower portion of the flexible display 512 and the display support member 513 using a first adhesive member 517 (e.g., adhesive or double-sided tape). According to an embodiment, the first adhesive member 517 may be disposed on the lower portion of the display support member 513, and the display support member 513 and the window 511 may be at least partially attached by the first adhesive member 517.

According to an embodiment, when the window 511 encloses the flexible display 512 and the display support member 513, a space 515 may be formed between one end of the flexible display 512 and the display support member 513 and the window 511. According to an embodiment, a second adhesive member 518 (e.g., organic compound, resin) may be injected into the formed space 515, and the formed space 515 may be filled with the second adhesive member 518. The second adhesive member 518 may be, for example, at least partially opaque. According to an embodiment, the second adhesive member 518 may help maintain the shape in which the window 511 encloses the flexible display 512 and the display support member 513 and help keep the window 511, the flexible display 512, and the display support member 513 in place. According to an embodiment, the window 511 may maintain a curved structure formed at one end of the flexible display 512 using the second adhesive member 518, and minimize gaps generated between the flexible display 512, the display support member 513, and the first support member 514. According to an embodiment, the second adhesive member 518 may fill a gap (e.g., separated space) between the flexible display 512 and the display support member 513 and prevent delamination between panels included in the flexible display 512. According to an embodiment, the second adhesive member 518 may prevent foreign materials from entering into the gap between the flexible display 512 and the display support member 513.

According to an embodiment, when the window 511 encloses the flexible display 512 and the display support member 513, a bezel region 516 positioned at both sides of the electronic device 500 may be made to be relatively thin. For example, the window 511 may at least partially enclose the flexible display 512 and the display support member 513 and may be at least partially attached to a lower surface of the display support member 513. A display assembly formed with the window 511, the flexible display 512, and the display support member 513 may be seated at an upper surface of the first support member 514. According to another embodiment, the window 511 may be at least partially attached to an upper surface of the first support member 514. The first support member 514 attached to the lower surface of the display support member 513 may be include a minimized bezel region 516.

The present disclosure does not limit the radius of curvature of the window 511 (e.g., the radius of curvature formed when the window 511 encloses the flexible display 512 and the display support member 513). In order to enclose the flexible display 512 and the display support member 513, the window 511 may be formed in various shapes corresponding to structures disposed at the periphery of the flexible display 512 and the display support member 513.

Figure 6:
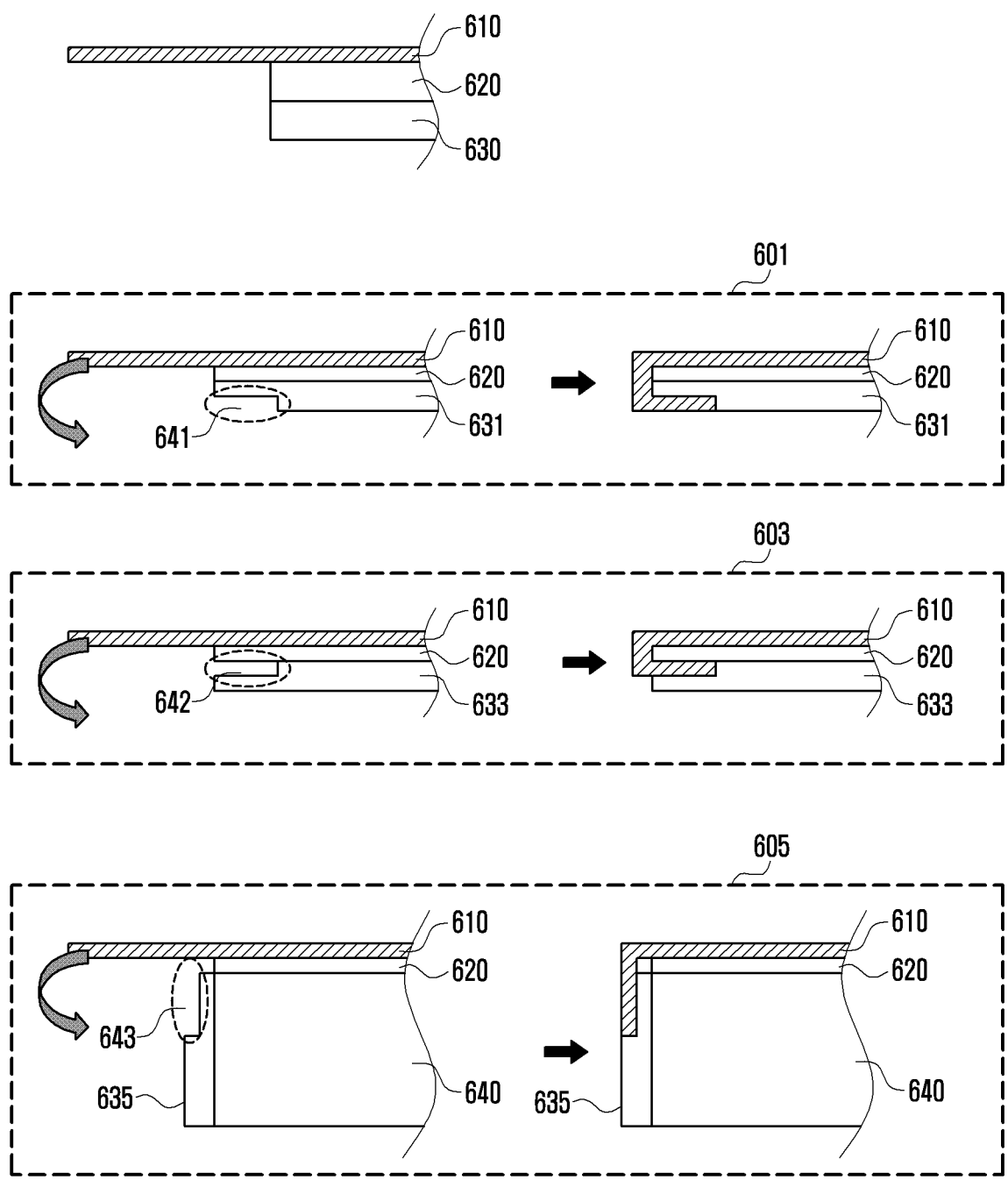
FIG. 6 is a diagram illustrating various methods of bending one end of a window attached to an upper portion of a flexible display according to certain embodiments.

FIG. 6 is a diagram illustrating various methods of bending one end of a window attached to an upper portion of a flexible display according to certain embodiments.

With reference to FIG. 6, a flexible display 620 (e.g., the flexible display 512 of FIG. 5) may be disposed between a window 610 (e.g., the window 511 of FIG. 5) and a display support member 630 (e.g., the display support member 513 of FIG. 5). FIG. 6 illustrates three embodiments in which the window 610 encloses at least a portion of the flexible display 620 and the display support member 630. According to certain embodiments, the window 610 may enclose the flexible display 620 and the display support member 630 in various forms depending on how the flexible display 620 and the display support member 630 are disposed.

With reference to a first embodiment 601 in FIG. 6, there is a space 641 to which the window 610 can be partially attached in the lower portion of the display support member 631, and when the window 610 is attached to the space 641, the window 610 encloses the flexible display 620 and the display support member 631. According to an embodiment, the window 610 of the electronic device 100 may at least partially enclose the flexible display 620 and the display support member 631 and be partially attached to the space 641 of the display support member 631. According to an embodiment, the space 641 may have the same thickness as the window 610, and when the window 610 is attached to the space 641, the bottom surface of the window 610 may be flush with the bottom surface of the display support member 631.

According to an embodiment, the space 641 may have a thickness larger than that of the window 610. Thus, a margin space may be provided such that the display support member 631 is stably seated in the first support member (e.g., the first support member 514 of FIG. 5). The margin space may be filled using a separate pillar member, and the pillar member may reinforce seating stability and impact resistance for the first support member 514 by using a member having elasticity different from that of the window 610. According to another embodiment, the space 641 may have a thickness thinner than that of the window 610. In this case, the first support member 514 may be formed to further include a margin space for attachment of the window 610. The margin space may be filled with a separate pillar member, and the pillar member may reinforce seating stability and impact resistance for the first support member 514 by using a member having elasticity different from that of the window 610.

With reference to a second embodiment 603, the shape of a display support member 633 may be such that a space 642 (e.g., a hole) exists between a flexible display 620 and the display support member 633. The window 610 may be inserted into and attached to the space 642 formed between the flexible display 620 and the display support member 633 while partially enclosing the flexible display 620. According to an embodiment, the window 610 of the electronic device 100 may at least partially enclose the flexible display 620 and be partially attached to the space 642 formed between the flexible display 620 and the display support member 633. According to an embodiment, the thickness of the space 642 may be substantially the same as the thickness of the window 610, so that the window 610 can be inserted into the space 642.

According to an embodiment, the thickness of the space 642 may be greater than the thickness of the window 610 so that a margin space is provided between the flexible display 620 and the display support member 633. The margin space may be filled using a separate pillar member, and the pillar member may reinforce seating stability and impact resistance to the window 610 by using a member having elasticity lower than that of the window 610.

With reference to a third embodiment 605, the electronic device 100 may have a structure in which an internal component 640 of the electronic device 100 is disposed under a flexible display 620. The display support member 635 may be disposed on a side portion of the internal component 640. The shape of the display support member 635 may be such that there is a space 643 to which the window 610 is partially to be attached. The window 610 may be attached to the space 643 so that it is partially covering the flexible display 620 and the display support member 635. Thus, according to an embodiment, the window 610 of the electronic device 100 may at least partially enclose the flexible display 620 and the display support member 635 and be partially attached to the space 643 formed at one surface of the display support member 635. According to an embodiment, the thickness of the space 643 may be substantially the same as the thickness of the window 610, so that when the window 610 is attached to the space 643, the outer surface of the window 610 may be flush with the outer surface of the display support member 635. According to another embodiment, the thickness of the space 643 may be greater than the thickness of the window 610 so as to provide a margin space such that the window 610 may be stably attached to the display support member 635. The margin space may be filled using a separate pillar member, and the pillar member may reinforce seating stability and impact resistance to the window 610 by using a member having lower elasticity than that of the window 610. In the third embodiment 605, by attaching the window 610 to the space 643, the electronic device 100 can improve its waterproof performance.

Figure 7:
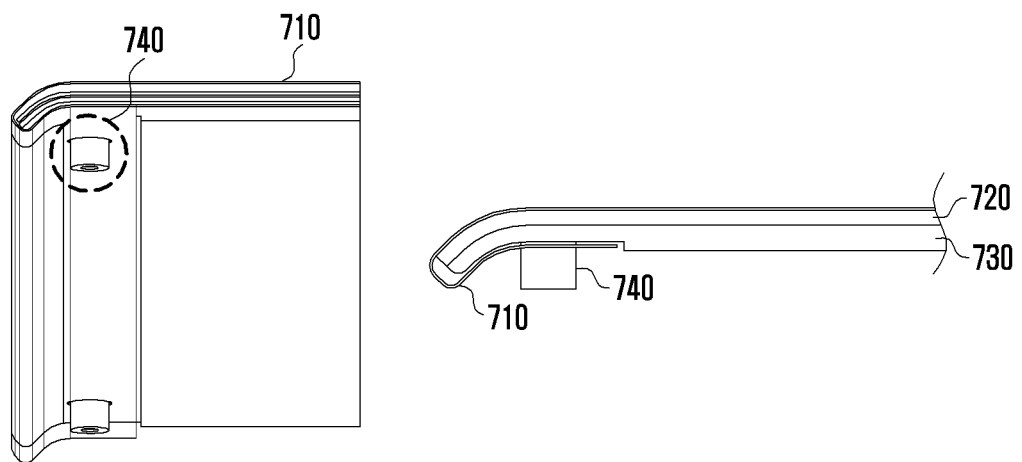
FIG. 7 is a diagram illustrating a structure for maintaining a form of a window attached to a flexible display according to an embodiment.

FIG. 7 is a diagram illustrating a structure for maintaining a form of a window 710 attached to a flexible display 720 according to an embodiment.

With reference to FIG. 7, in the electronic device 100, the flexible display 720 (e.g., the flexible display 512 of FIG. 5) may be disposed between the window 710 and a display support member 730 (e.g., the display support member 513 of FIG. 5), and the window 710 (e.g., the window 511 of FIG. 5) may enclose at least part of the display support member 730 and the flexible display 720.

According to an embodiment, the display support member 730 may include a structure (e.g., fixing member 740) for help fix the window 710 on the bottom surface of the display support member 730, where the bottom surface of the display support member 730 is opposite the surface of the display support member 730 that is attached to the flexible display 720. For example, the display support member 730 may include the fixing member 740. The fixing member 740 may be integrally formed as part of the display support member 730 or may be an initially separate component that is at least partially coupled to the display support member 730. The fixing member 740 may have a fastening structure corresponding to a screw, riveting, or fusion fixing. The first support member (e.g., the first support member 514 of FIG. 5) may be fastened and fixed to the fixing member 740 based on the fastening structure formed in the fixing member 740. The window 710 attached to at least part of the bottom surface of the display support member 730 may have an opening so that the fixing member 740 may pass through. The fixing member 740 may partly penetrate the window 710 and thus help fix the window 710 in place.

According to an embodiment, the window 710 may be formed to enclose the flexible display 720 and the display support member 730. The display support member 730 may include at least one fixing member 740 for preventing the window 710 from springing back. The first support member (e.g., the first support member 514 of FIG. 5) positioned below the display support member 730 may include a fastening structure for fastening the fixing member 740 to the first support member. The fastening structure formed in the first support member may be coupled to the fixing member 740 and prevent the spring back phenomenon of the flexible display 720 and the window 710.

FIG. 8A to 8D are diagrams illustrating a method of attaching a window to correspond to various forms of housing according to certain embodiments.

Figure 8A:
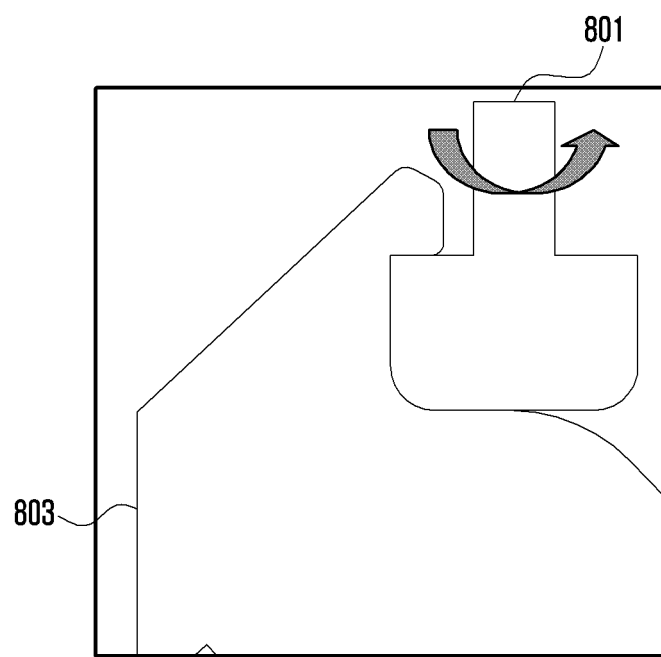
FIG. 8A, FIG. 8B, FIG. 8C and FIG. 8D are diagrams illustrating a method of attaching a window to correspond to various forms of housing according to certain embodiments.

FIG. 8A illustrates a structure of a housing 803 (e.g., the side bezel structure 310 of FIG. 3) for fixing a position of a flexible display 820 (e.g., the flexible display 512 of FIG. 5) and a display support member 830 (e.g., the display support member 513 of FIG. 5). The shape of the housing 803 may correspond to the shapes of the flexible display 820 and the display support member 830, and the housing 803 may be produced in a fitting structure or an undercut form using a production tool 801. According to an embodiment, the shape of the production tool 801 may correspond to the shapes of the flexible display 820 and the display support member 830.

Figure 8B:
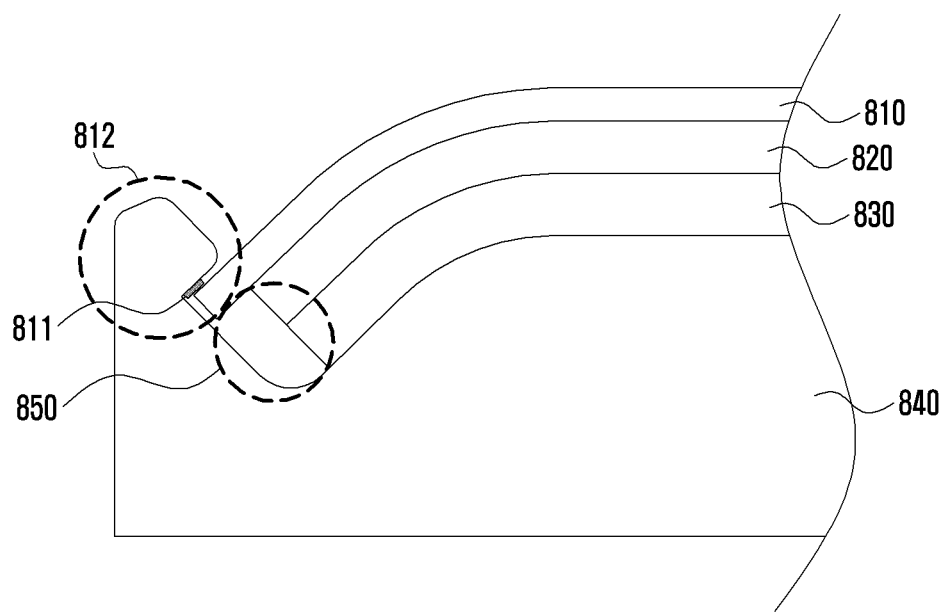
Figure 8C:
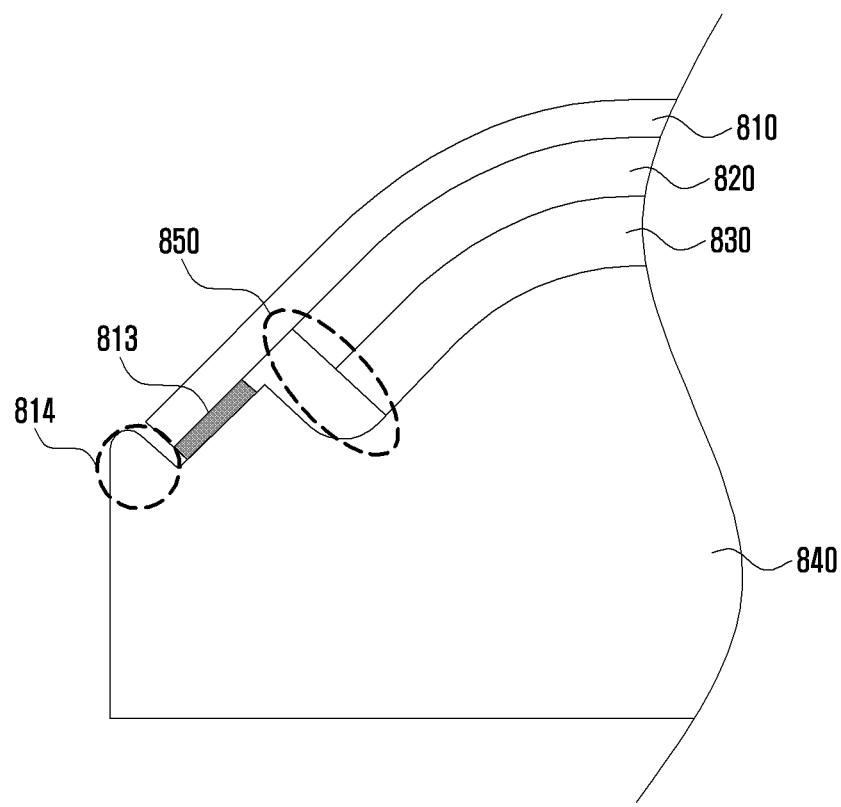
Figure 8D:
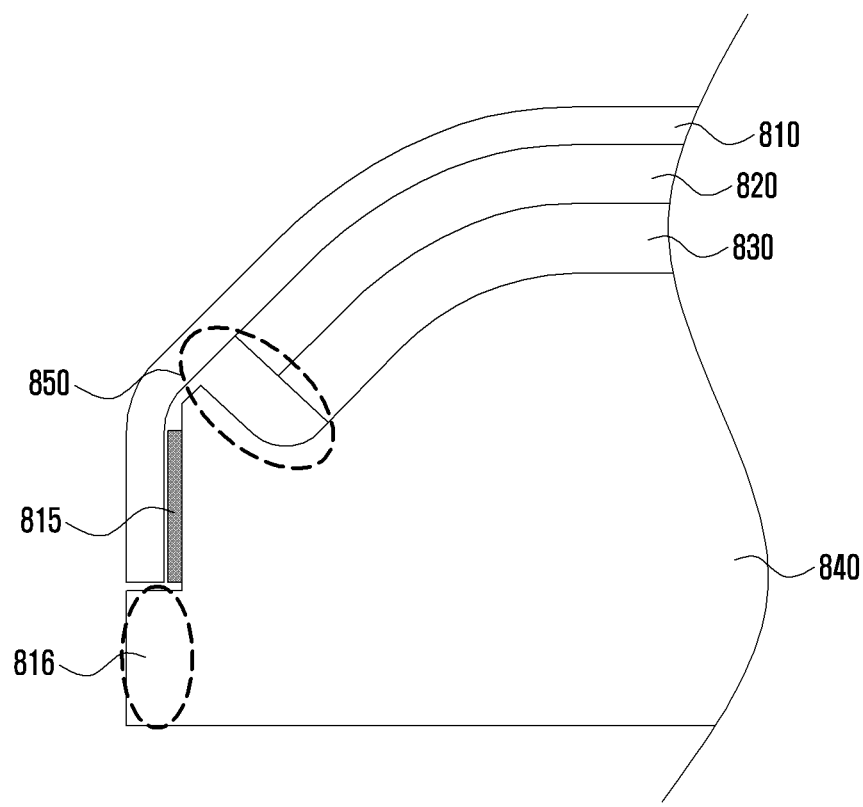

FIGS. 8B to 8D illustrate three embodiments in which the window 810 is attached to the housing 840.

According to an embodiment described in relation to FIG. 8B, a window 810 disposed on the upper surface of the flexible display 820 may be at least partially attached to the housing 840 (e.g., the side bezel structure 310 of FIG. 3). According to an embodiment, the housing 840 may be formed such that a member 812 of an outer portion in which one end of the flexible display 820 and the display support member 830 are disposed is higher than the window 810. According to the first embodiment, because the member 812 of an outer portion of the housing 840 is higher than the window 810, the outer portion of the housing 840 may be formed to enclose the window 810, the flexible display 820, and the display support member 830. According to an embodiment, an adhesive member 811 (e.g., elastic rubber or tape) may be used between the outer portion of the window 810 and the housing 840 to partially attach the window 810 and the housing 840. According to an embodiment, a space 850 may be formed between the flexible display 820, the display support member 830, and the housing 840, and the space 850 may be filled with an organic compound material such as a resin.

According to a second embodiment described in relation to FIG. 8C, the housing 840 (e.g., the side bezel structure 310 of FIG. 3) may be produced in a form in which the window 810 may be extended to be partially attached to the housing 840. The window 810 may have a size larger than that of the flexible display 820 and may be partially attached to the housing 840. According to an embodiment, the housing 840 may be formed to include a step 814, where the step 814 is higher than the outer surface of the window 810 when the window 810 is mounted on the housing 840. According to an embodiment, because the step 814 is higher than the window 810, peeling between the window 810 and the flexible display 820 may be prevented. According to an embodiment, the window 810 and the housing 840 may be partially attached by using a first adhesive member 813 (e.g., the first adhesive member 517 of FIG. 5, rubber, or tape) therebetween. According to an embodiment, a space 850 may be formed between the flexible display 820 and the housing 840, and the space 850 may be filled with a second adhesive member (e.g., the second adhesive member 518 of FIG. 5 (e.g., organic compounds, resins)).

According to a third embodiment described in relation to FIG. 8D, a housing 840 (e.g., the side bezel structure 310 of FIG. 3) may be produced in a form in which the window 810 may be extended to be partially attached to a side surface of the housing 840. The window 810 may have a size larger than that of the flexible display 820 and may be extended to be attached to the side surface of the housing 840. For example, the window 810 may be at least partially attached to the side portion of the housing 840 that corresponds to a bezel region. According to an embodiment, the housing 840 may be include a step 816 that is higher than the outer surface of the window 810. According to an embodiment, because the step 816 is higher than the window 810, peeling between the window 810 and the flexible display 820 may be prevented. According to an embodiment, the window 810 and the housing 840 may be partially attached by using a first adhesive member 815 (e.g., the first adhesive member 517 of FIG. 5, rubber, tape) therebetween. According to an embodiment, the fixture of the window 810 in the FIG. 8D embodiment may be stronger than the embodiments of FIGS. 8B-8C. Thus, the embodiment of FIG. 8D may more efficiently prevent delamination of the flexible display 820. According to an embodiment, a space 850 may be formed between the flexible display 820 and the display support member 830 and the housing 840, and the space 850 may be filled with a second adhesive member (e.g., the second adhesive member 518 of FIG. 5 (e.g., an organic compound, a resin)).

Figure 9A:
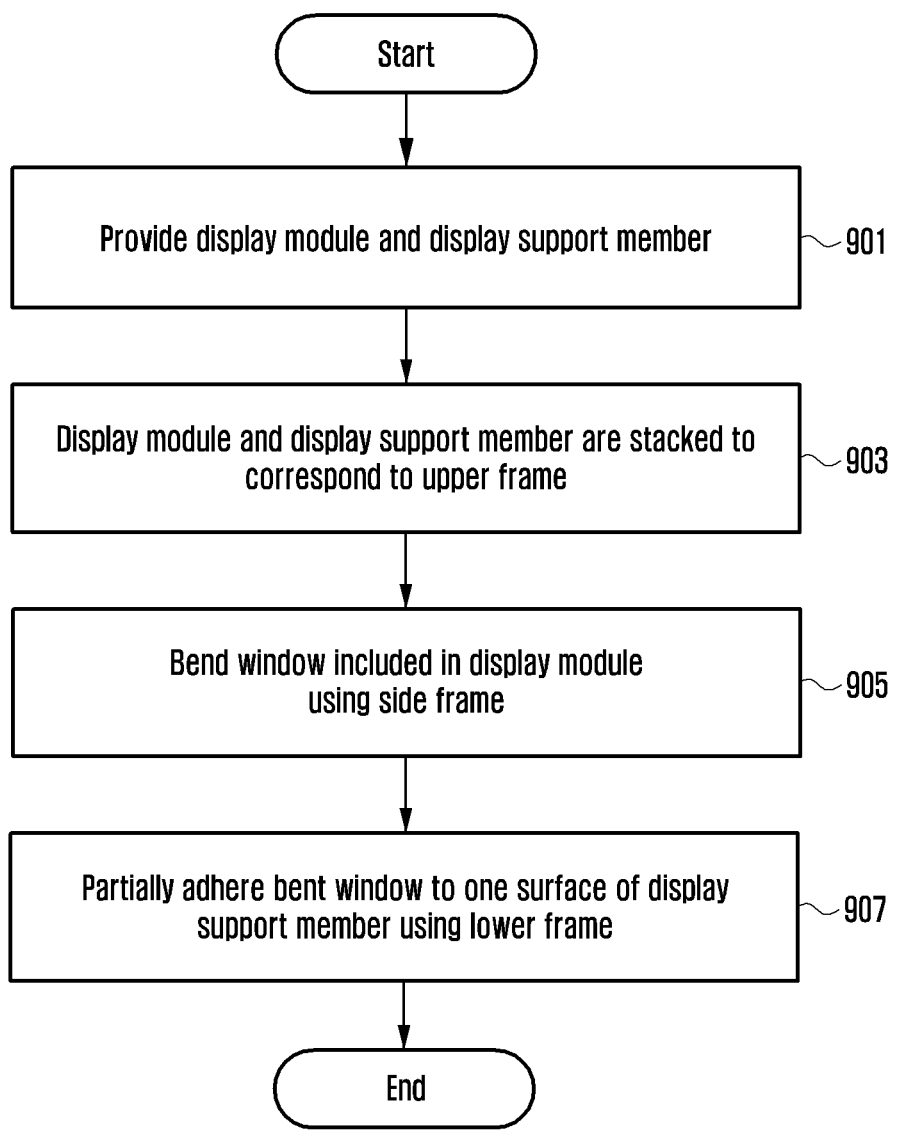
FIG. 9A, FIG. 9B and FIG. 9C are a flowchart and diagrams illustrating an operation of forming of a flexible display according to an embodiment.
Figure 9B:
Figure 9C:
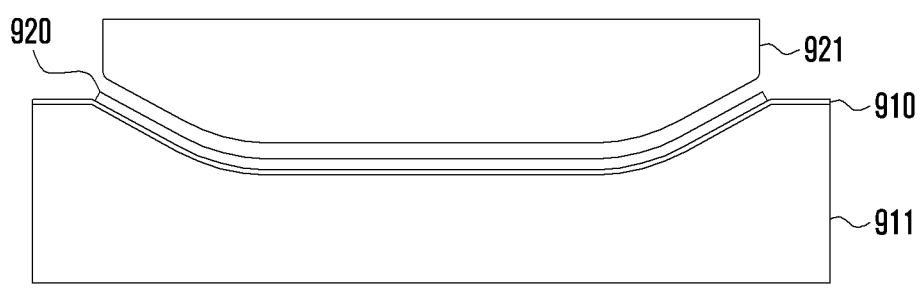

FIG. 9A to 9C are a flowchart and diagrams illustrating an operation of forming a display module according to an embodiment.

FIG. 9A is a flowchart illustrating an operation of bending a window of a display module.

With reference to FIG. 9A, in operation 901, a display module including a window (e.g., window 511 of FIG. 5) and a flexible display (e.g., the flexible display 512 of FIG.

5)) and a display support member (e.g., the display support member 513 of FIG. 5) may be provided. Although not illustrated, at least one jig and roller for bending the display module may also be provided.

In operation 903, the display module (e.g., an assembly formed based on the window 511 and the flexible display 512) and the display support member 513 may be disposed in a stack structure to correspond to an upper frame (e.g., a first jig). The window 511 included in the display module may be larger in size than the flexible display 512 so as to at least partly enclose the flexible display 512 and the display support member 513. For example, the window 511 may have an extended length to correspond to one end so as to enclose the one end of the flexible display 512. The window 511 may have an extended length to correspond to the other end so as to enclose the other end of the flexible display 512 corresponding to an opposite direction of the one end.

In operation 905, at least a portion of the window 511 may be bent using a side frame (e.g., a second jig). For example, in the window 511 having an extended length to correspond to one end and the other end of the flexible display 512, some areas having an extended length may be bent by the side frame. Some areas having an extended length may be bent in the form partly enclosing the flexible display 512.

In operation 907, some areas (e.g., the edge of the window 511) of the bent window 511 may be partially adhered and pressed to one surface of the display support member 513 using a lower frame (e.g., a third jig). For example, some areas having an extended length of the window 511 may be bent by the lower frame and be partially attached to one surface (e.g., a lower portion of the display support member 513) of the display support member 513. The fabrication process illustrated in FIG. 9A may be a fabrication process in which the window 511 included in the display module is bent to at least partly enclose the flexible display 512 and the display support member 513.

FIGS. 9B and 9C are diagrams illustrating a production process of a display module including a window 511 and a flexible display 512.

With reference to FIG. 9B, a window 910 (e.g., the window 511 of FIG. 5) may be disposed in a first structure 911. For example, the surface where the first structure 911 and the window 910 are touching may be the front portion of the window 910. According to an embodiment, the window 910 may be made of a flexible material (e.g., a film) that may be freely bent. The shape of the window 910 may be formed based on the shape of the first structure 911. For example, the window 910 may be deformed or partially bent using heat generated by the first structure.

With reference to FIG. 9C, in a state in which the window 910 is disposed in the first structure 911, a flexible display 920 (e.g., the flexible display 512 of FIG. 5) may be disposed onto the window 910. A second structure 921 may be disposed on one surface of the flexible display 920. According to an embodiment, the window 910 and the flexible display 920 disposed between the first structure 911 and the second structure 921 may be pressed by a force generated between the first structure 911 and the second structure 921 so as to be pressed into the same shape. Accordingly, the shape of the display module (e.g., the window 910 and the flexible display 920) may be formed based on the shape of the first structure 911 and the second structure 921.

FIGS. 10A to 10D illustrate process operations for enclosing a flexible display using a window according to an embodiment.

Figure 10A:
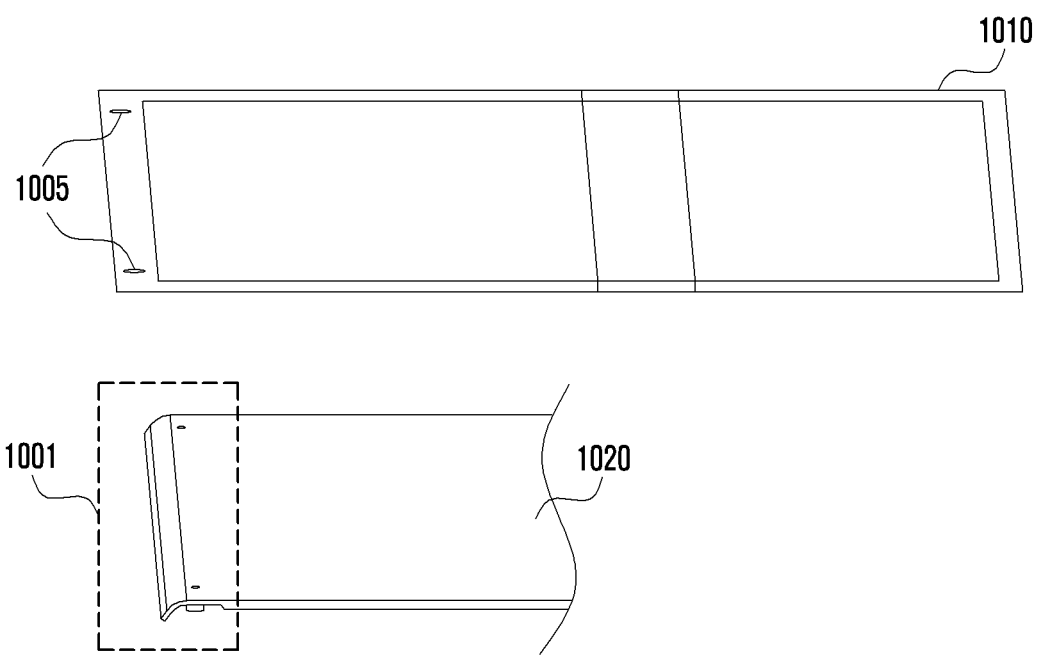
FIG. 10A, FIG. 10B, FIG. 10C, FIG. 10D and FIG. 10E are diagrams illustrating process operations for enclosing a flexible display using a window according to an embodiment.

FIG. 10A is a diagram illustrating a window 1010 (e.g., the window 511 of FIG. 5) and a flexible display 1020 (e.g., the flexible display 512 of FIG. 5).

According to an embodiment, the flexible display 1020 may be disposed between the window 1010 and the display support member (e.g., the display support member 513 of FIG. 5). For example, at least a portion of the window 1010 may be attached to at least a portion of the display support member to enclose the flexible display 1020. According to another embodiment, the display support member may include a fixing member (e.g., the fixing member 740 of FIG. 7) for fixing the window 1010, and at least one opening 1005 corresponding to the fixing member may be formed in the window 1010.

According to an embodiment, the size of the window 1010 may be greater than that of the flexible display 1020. For example, the window 1010 may be extended beyond a side of the flexible display 1020 and may be bent to partially enclose that side of the flexible display 1020. According to an embodiment, the other end corresponding to an opposite direction of the one end may be extended further than a length to the other end of the flexible display 1020, and the window 1010 may be bent to partially enclose the other end of the flexible display 1020 to correspond to an extended length of the other end. According to an embodiment, the window 1010 may enclose the bent portion 1001 of the flexible display 1020.

Figure 10B:
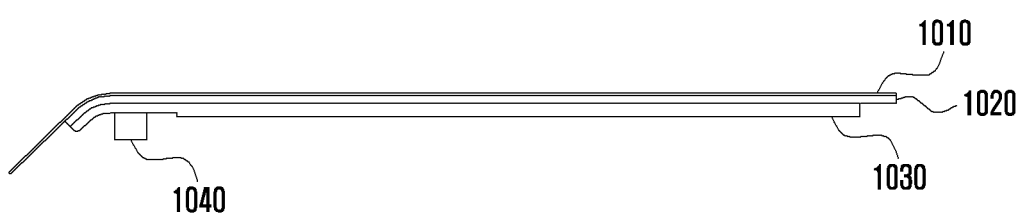

With reference to FIG. 10B, the flexible display 1020 may be disposed between the window 1010 and a display support member 1030 (e.g., the display support member 513 of FIG. 5). The window 1010 and the flexible display 1020 may constitute a display module. According to an embodiment, the display support member 1030 may include a fixing member 1040 for partially fixing the location of the window 1010 with respect to the bottom surface of the display support member 1030. The fixing member 1040 may, for example, penetrate the window 1010. The window 1010 may include one or more openings (e.g., opening 1005 of FIG. 10A) corresponding to the fixing member 1040. According to an embodiment, the window 1010 may be penetrated by the fixing member 1040 while at least partially enclosing the flexible display 1020 and the display support member 1030, and the window 1010 may be fixed by the fixing member 1040.

Figure 10C:
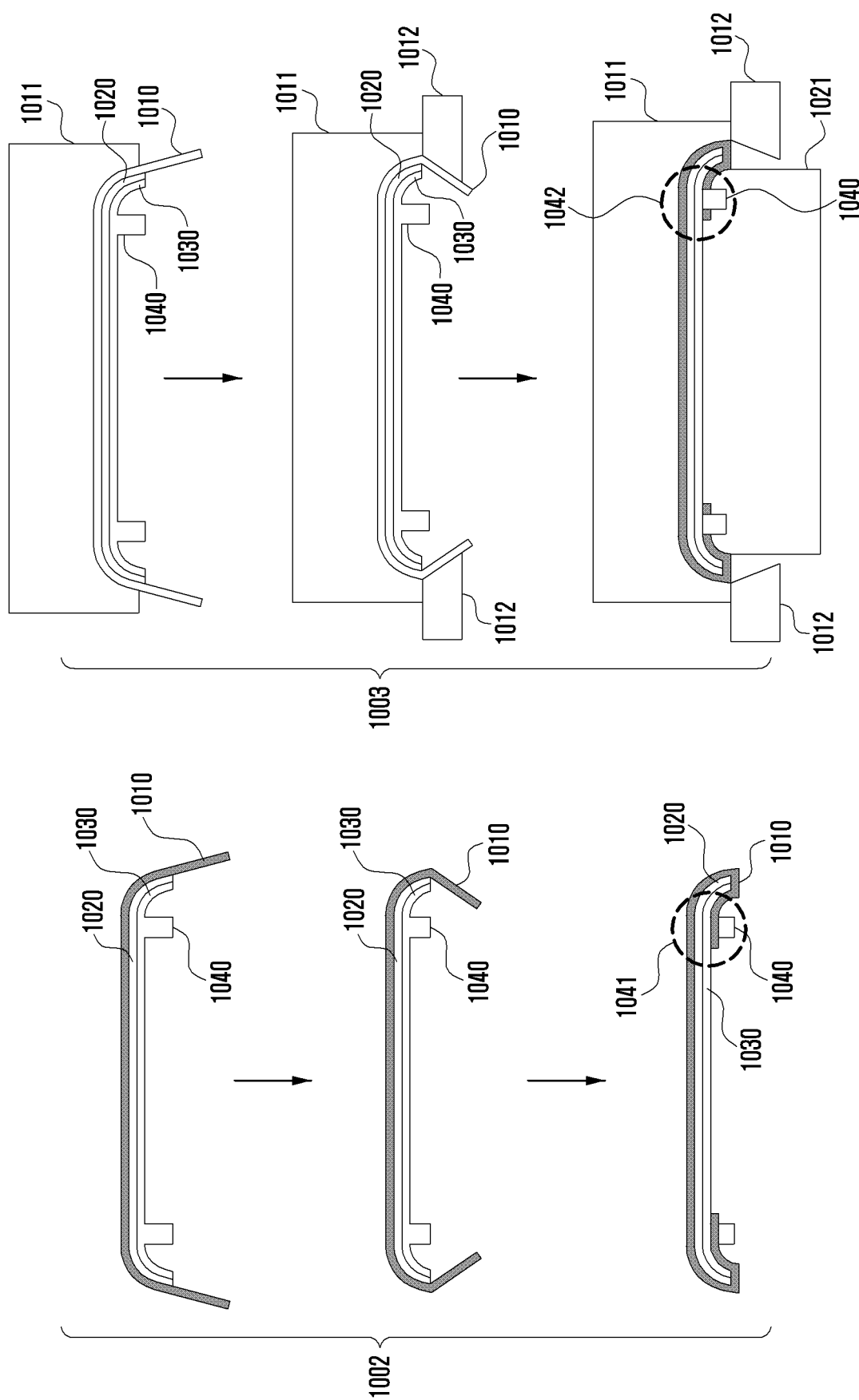

FIG. 10C illustrates an operation of bending the window 1010 to be fixed by the fixing member 1040 while at least partially enclosing the flexible display 1020 and the display support member 1030. FIG. 10C illustrates an operation 1002 of bending the window 1010 without a jig and an operation 1003 of bending the window 1010 using at least one jig (e.g., an upper jig 1011 (first jig), a side jig 1012 (second jig), and a lower jig 1021 (third jig)).

According to an embodiment, the window 1010 may be larger than the flexible display 1020 and the display support member 1030 so that edges of the window 1010 extend beyond those of the flexible display 1020 and the display support member 1030. The extended edges of the window 1010 may partially enclose ends of the flexible display 1020 and the display support member 1030. The window 1010 may have an extended length to correspond to the other ends so as to partially enclose the other ends corresponding to an opposite direction of the one end of the flexible display 1020 and the one end of the display support member 1030.

According to an embodiment, the window 1010 may be bent to at least partially enclose the flexible display 1020 and the display support member 1030 by the upper jig 1011. The window 1010 may be bent by the side jig 1012 such that the window 1010's extended edges at least partly enclose the flexible display 1020 and the display support member 1030. The window 1010 may be bent by the lower jig 1021 such that its extended edges face the bottom surface of the display support member 1030. The window 1010's extended edges may be at least partly attached and pressed to the bottom surface of the display support member 1030 by the lower jig 1021. According to an embodiment, when the window 1010 is bent by the lower jig 1021, the fixing member 1040 included in the display support member 1030 may penetrate an opening (e.g., the opening 1005 of FIG. 10A) formed in the window 1010. The fixing member 1040 of the display support member 1030 may keep the window 1010 in place with respect to the flexible display 1020 and the display support member 1030. The window 1010, the flexible display 1020, and the display support member 1030 may be prevented from springing back by the fixing member 1040. A display assembly formed with the window 1010, the flexible display 1020, and the display support member 1030 may be fastened to the housing (e.g., the first support member 514 of FIG. 5) of the electronic device based on the fixing member 1040.

Figure 10D:
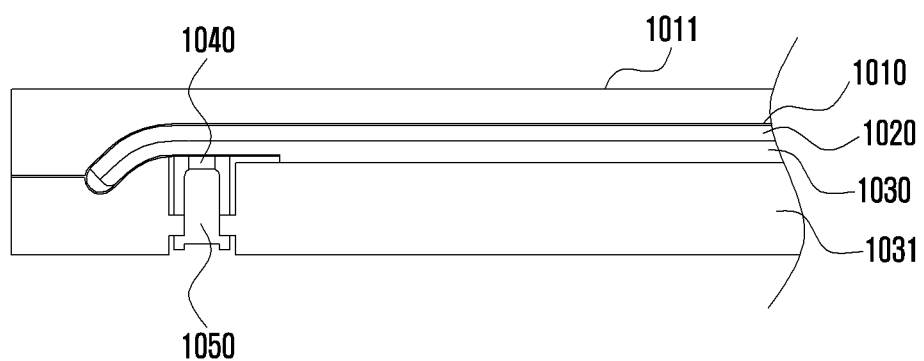

FIG. 10D illustrates an operation of compressing/attaching the flexible display 1020 and the display support member 1030 using the first assembly jig 1011 (e.g., an upper frame) and the second assembly jig 1021 (e.g., a lower frame) so that the window 1010 at least partially encloses the flexible display 1020 and the display support member 1030. For example, the window 1010, the flexible display 1020, and the display support member 1030 may be stacked to correspond to the first assembly jig 1011. The stacked window 1010, flexible display 1020, and display support member 1030 may be attached to each other by the first assembly jig 1011 and the second assembly jig 1021. As explained above, the display support member 1030 may include a fixing member 1040 to help fix the window 1010, and the fixing member 1040 may have a fastening structure corresponding to a screw, riveting, or fusion fixing. The fixing member 1040 may penetrate the opening 1005 formed in the window 1010 to keep the window 1010, the flexible display 1020, and the display support member 1030 in place. A first support member 1031 (e.g., the first support member 514 of FIG. 5) may be disposed below the display support member 1030, and the first support member 1031 may include a fastening structure 1050 for fastening to the fixing member 1040. As the fixing member 1040 and the fastening structure 1050 of the first support member 1031 are fastened to each other, the window 1010, the flexible display 1020, and the display support member 1030 may be maintained in place, and springing back may be prevented.

According to an embodiment, the flexible display 1020 and the display support member 1030 may be attached to each other by an adhesive member, and the window 1010 may be at least partially attached to the bottom surface of the display support member 1030 using another adhesive member.

Figure 10E:
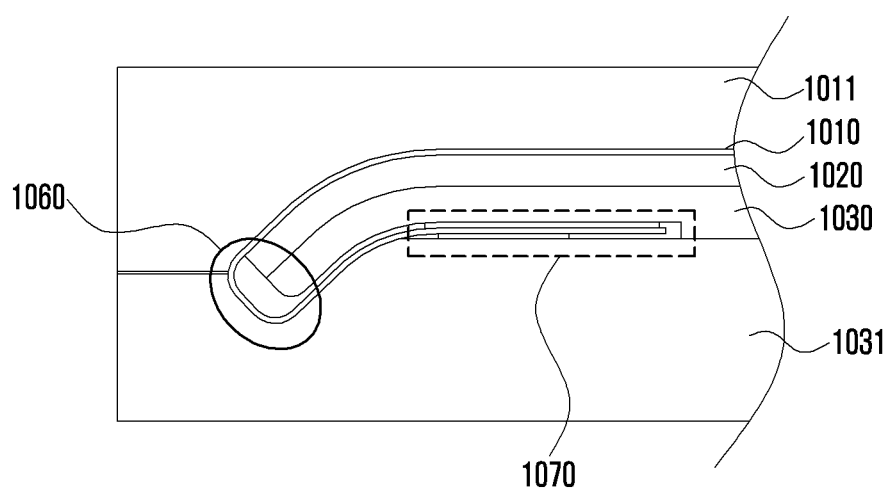

FIG. 10E illustrates the window 1010 at least partially enclosing the flexible display 1020 and the display support member 1030.

With reference to FIG. 10E, the window 1010 may be at least partially attached to one surface of the display support member 1030 while enclosing the flexible display 1020 and the display support member 1030. An adhesive member 1070 (e.g., the first adhesive member 517 of FIG. 5) may be used between the window 1010 and the display support member 1030, and the adhesive member may be made of a material that does not damage the window 1010 and the display support member 1030. With reference to FIG. 10E, while the window 1010 encloses the flexible display 1020 and the display support member 1030, a space 1060 may be generated in some area in which the window 1010 is bent. According to an embodiment, the space 1060 may be filled with a second adhesive member (e.g., the second adhesive member 518 of FIG. 5). According to an embodiment, the second adhesive member may prevent a foreign material from entering into the space 1060.

Figure 11A:
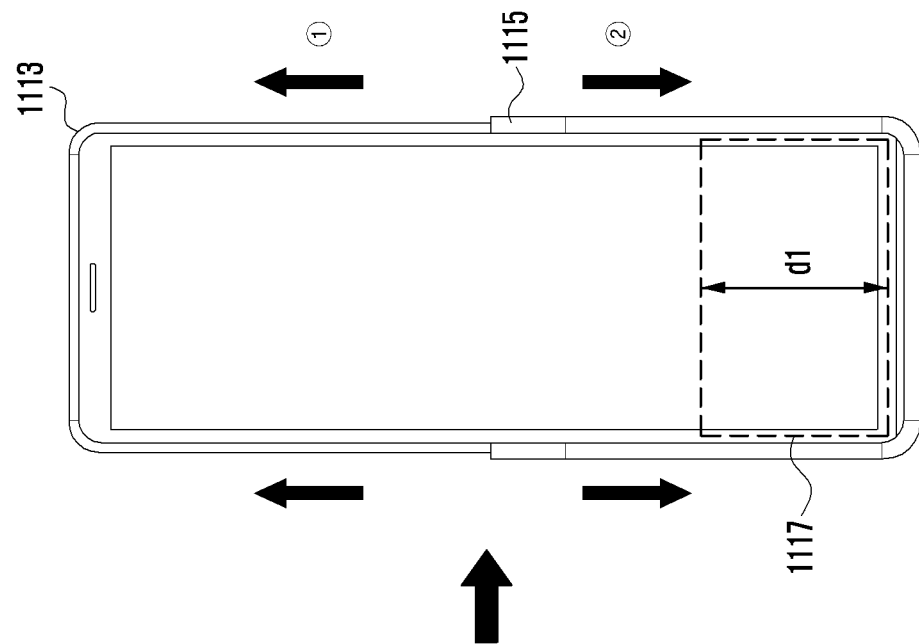
FIG. 11A, FIG. 11B and FIG. 11C are diagrams illustrating structures in which a flexible display is bent according to certain embodiments.
Figure 11A:
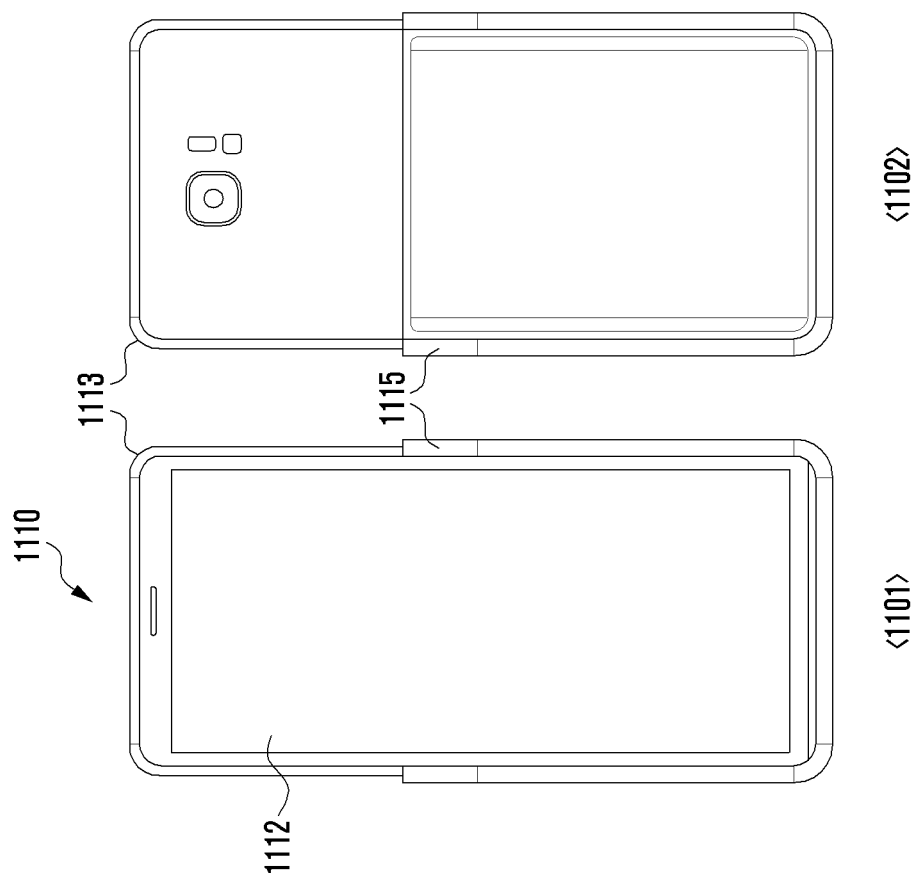
Figure 11B:
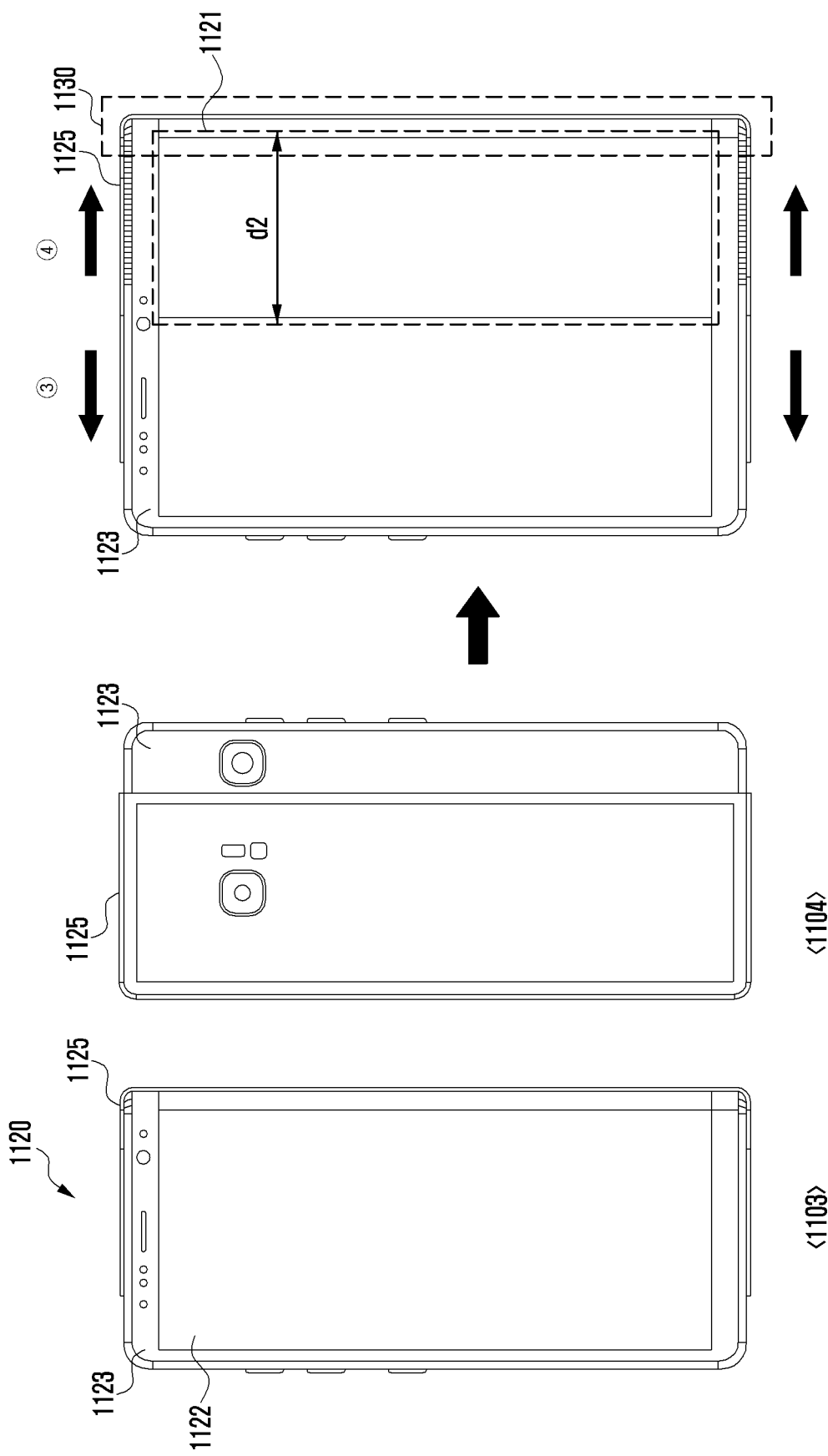
Figure 11C:
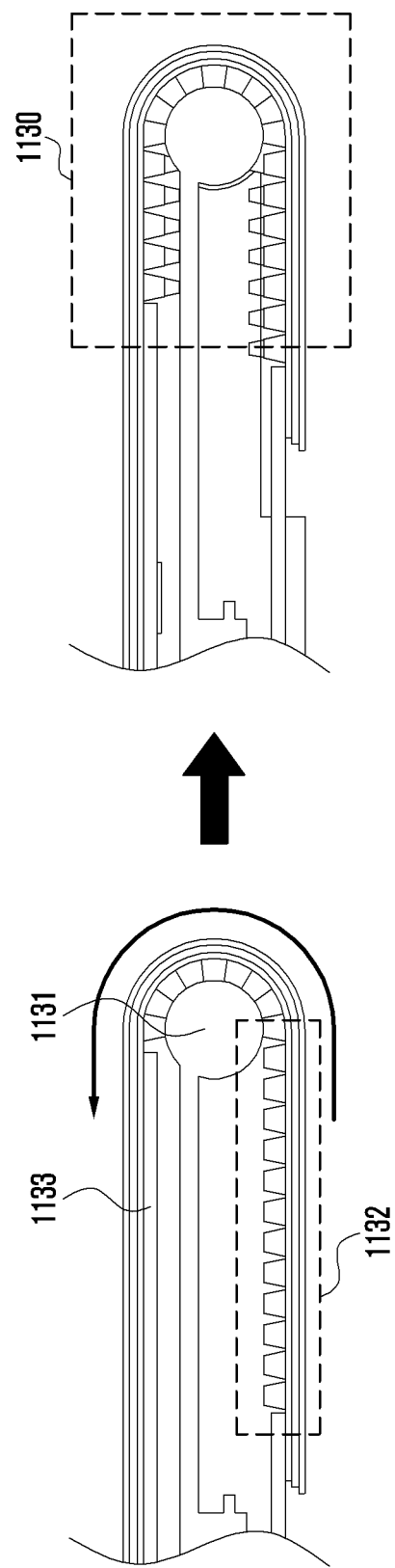

FIGS. 11A and 11C illustrate structures in which a flexible display is bent according to certain embodiments.

FIG. 11A illustrates a front perspective view and a rear perspective view of an electronic device 1110 (e.g., the electronic device 100 of FIG. 1). In the electronic device 1110, at least part of a flexible display 1112 (e.g., the flexible display 512 of FIG. 5) may be bent. The electronic device 1110 may be formed with a first structure 1113 (e.g., a main device) and a second structure 1115 (e.g., an auxiliary device), and the first structure 1113 may be at least partially coupled to the second structure 1115. The electronic device 1110 may display contents on its exposed area.

According to an embodiment, the electronic device 1110 may have an open state and a closed state. The open state may be a state in which at least part of a bendable portion 1117 is exposed to the outside of the electronic device 1110, and the closed state may be a state in which the bendable portion 1117 is not exposed to the outside. When the electronic device 1110 is in the closed state, at least a partial area of the bendable portion 1117 of the flexible display 1112 may be positioned between the first structure 1113 and the second structure 1115. The electronic device 1110 may transition from the closed state to the open state when the user moves the first structure 1113 apart from the second structure 1115 using a sliding action. When the electronic device 1110 is in the open state, at least a partial area of the bendable portion 1117 may be extended and be exposed. For example, the first structure 1113 may move in a first direction (e.g., a direction ①). The first structure 1113 and the second structure 1115 may move by a predetermined distance d1, and the display area of the flexible display 1112 may be extended by the predetermined distance d1. Thus, the display area of the flexible display 1112 may be extended by an area of the bendable portion 1117.

According to an embodiment, the electronic device 1110 may use a flexible window (e.g., the window 511 of FIG. 5) that may be attached to the bent portion of the flexible display 1112 (e.g., the flexible display 512 of FIG. 5), and the window may at least partially enclose the flexible display 1112 and the display support member (e.g., the display support member 513 of FIG. 5).

According to an embodiment, when the flexible display 1112 forms an edge design to correspond to an opposite direction of the bendable portion 1117, the window (e.g., the window 511 of FIG. 5) may be formed to at least partially enclose the flexible display 1112 (e.g., the flexible display 512 of FIG. 5) and the display support member (e.g., the display support member 513 of FIG. 5). According to various embodiments, the window 511 may be formed to enclose the flexible display 512 and the display support member 513 to correspond to one edge having an edge design, and the window 511 may be formed in an enclosing form to correspond to the other end corresponding to an opposite direction of the one end.

FIG. 11B illustrates a front perspective view 1103 and a rear perspective view 1104 of an electronic device 1120 (e.g., the electronic device 100 of FIG. 1). In the electronic device 1120, at least part of a flexible display 1122 (e.g., the flexible display 512 of FIG. 5) may be bent. The electronic device 1120 may be formed with a first structure 1123 (e.g., a main device) and a second structure 1125 (e.g., an auxiliary device), and the first structure 1123 may be coupled partially to the second structure 1125. The electronic device 1120 may display contents on its exposed area.

According to an embodiment, the electronic device 1120 may have an open state and a closed state. The open state may be a state in which at least part of a bendable portion 1121 is exposed to the outside of the electronic device 1120, and the closed state may be a state in which the bendable portion 1121 is not exposed to the outside. A side region (e.g., left side, right side) of the flexible display 1122 may be bent. When the electronic device 1120 is in the closed state, at least a partial area of the bendable portion 1121 may be positioned between the first structure 1123 and the second structure 1125. The electronic device 1120 may transition from the closed state to the open state when the user moves the first structure 1123 apart from the second structure 1125 using a sliding action. When the electronic device 1120 is in the open state, at least a partial area of the bendable portion 1121 may be extended and be exposed. For example, the first structure 1123 may move in a third direction (e.g., direction ③)), and the second structure 1125 may move in a fourth direction (e.g., direction ④)). The first structure 1123 and the second structure 1125 may move by a predetermined distance d2, and the display area of the flexible display 1122 may be extended to correspond to the predetermined distance d2.

According to an embodiment, when the flexible display 1122 forms an edge design to correspond to an opposite direction of the bendable portion 1121, the window (e.g., the window 511 of FIG. 5) may at least partially enclose the flexible display 1122 (e.g., the flexible display 512 of FIG. 5) and the display support member (e.g., the display support member 513 of FIG. 5). According to various embodiments, the window 511 may be formed to enclose the flexible display 512 and the display support member 513 to correspond to one edge having an edge design, and the window 511 may be formed in an enclosing form to correspond to the other end corresponding to an opposite direction of the one end.

FIG. 11C is a diagram illustrating a structure 1130 in which the display is bent. The bending structure 1130 of FIG. 11C may correspond to the bending structure 1130 of FIG. 11B.

With reference to FIG. 11C, the bending structure 1130 may include a hinge 1131 and at least one rail 1132. According to an embodiment, the hinge 1131 may be partially enclosed by at least one rail 1132. The hinge 1131 may be configured to bend at least one of the flexible display (e.g., the flexible display 512 of FIG. 5), a support member 1133 (e.g., the display support member 513 of FIG. 5) that supports the flexible display, and at least one rail 1132. In the bending structure 1130, the support member 1133 and the at least one rail 1132 may be bent to correspond to a bending direction of the hinge 1131.

According to an embodiment, the window (e.g., the window 511 of FIG. 5) attached to an upper portion of the flexible display (e.g., the flexible display 512 of FIG. 5) may at least partially enclose the flexible display. According to an embodiment, even if there is a bending operation, the window of a form that encloses the flexible display may be fixed.

An electronic device according to an embodiment of the present disclosure includes a housing (e.g., the first support member 514 of FIG. 5) including a recess; an internal structure (e.g., the display support member 513 of FIG. 5) disposed in the recess, and a display (e.g., the flexible display 512 of FIG. 5) disposed in the recess and supported by the internal structure 513, wherein the display 512 includes a display panel including a first region and a second region, wherein the second region forms at least part of an edge of the display panel; and a flexible polymer layer (e.g., the window 511 of FIG. 5) forming an outer surface of the display panel, wherein the flexible polymer layer includes a first portion covering the first region and the second region, and a second portion extending from the first portion, enclosing the at least part of an edge of the display panel, and extending inward.

According to an embodiment, the display panel may further include a resin (e.g., the second adhesive member 518 of FIG. 5) between the at least part of the edge of the display panel and the second portion of the flexible polymer layer 511.

According to an embodiment, the resin may be at least partially opaque.

According to an embodiment, the flexible polymer layer 511 may include at least one of polyimide (PI), polycarbonate (PC), polyether sulfone (PES), polyethylene terephthalate (PET), polyethylene naphthalate (PEN), or glass fiber reinforced plastic (FRP).

According to certain embodiments, the second region of the display panel may be at least partially curved or bent.

According to an embodiment, the housing (e.g., the first support member 514 of FIG. 5) may include a side member integrally formed with the internal structure 513, and the side member surrounds the recess.

According to an embodiment, the display panel may include a touch sensitive panel and an organic light emitting layer.

According to an embodiment, the electronic device may further include an adhesive member configured to adhere the flexible polymer layer 511 to at least one of the internal structure 513 and the display panel.

According to an embodiment, the adhesive member 517 may include elastic rubber and tape.

According to an embodiment, the internal structure 513 may include a fixing member (e.g., the fixing member 740 of FIG. 7) configured to keep the flexible polymer layer 511 in place with respect to the internal structure 513, and the flexible polymer layer 511 may include at least one opening penetrated by the fixing member 740.

According to an embodiment, the shape of the housing (e.g., the first support member 514 of FIG. 5) corresponds to the shape of the display 512, and the flexible polymer layer 511 may be at least partially attached to the housing.

An electronic device in which a bent display 512 according to an embodiment of the present disclosure includes a bending structure (e.g., the bending structure 1130 of FIG. 11) disposed on one end of the display 512, and an internal structure 513 disposed on one surface of the display 512; wherein the display 512 is bent by the bending structure 1130, supported by the internal structure 513, and includes a display panel including a first region and a second region, wherein the second region forms at least part of an edge of the display panel; and a flexible polymer layer 511 configured to form an outer surface of the display panel, wherein the flexible polymer layer 511 includes a first portion enclosing the first region and the second region of the display panel and a second portion extending from the first portion, enclosing an edge of the display panel and at least a portion of the bending structure 1130, and extending inward.

According to an embodiment, the display panel may further include a resin between the edge and the second portion of the flexible polymer layer 511.

According to an embodiment, the resin may be at least partially opaque.

According to an embodiment, the second region of the display panel may be at least partially curved or bent to correspond to the bending structure.

According to an embodiment, a display area of the display 512 may be extended or reduced based on a bending direction of the bending structure 1130.

According to an embodiment, the electronic device may further include an adhesive member 517 configured to adhere the flexible polymer layer 511 to at least one of the internal structure 513 and the display panel.

According to an embodiment, the adhesive member 517 may include elastic rubber and tape.

According to an embodiment, the internal structure 513 may include a fixing member (e.g., the fixing member 740 of FIG. 7) configured to keep the flexible polymer layer 511 in place with respect to the internal structure 513, and the flexible polymer layer 511 may include at least one opening (e.g., the openings 1005 of FIG. 10A) penetrated by the fixing member 740.

The term "module" used in this disclosure may refer to a certain unit that includes one of hardware, software and firmware or any combination thereof. The module may be interchangeably used with unit, logic, logical block, component or circuit, for example. The module may be the minimum unit, or part thereof, which performs one or more particular functions. The module may also be formed mechanically or electronically. For example, the module disclosed herein may include at least one of an application-specific integrated circuit (ASIC) chip, field-programmable gate arrays (FPGAs), and programmable-logic device, which have been known or are to be developed At least part of the device (e.g., modules or functions thereof) or method (e.g., operations) according to various embodiments may be implemented as commands stored, e.g., in the form of program modules, in a computer-readable storage medium. In case commands are executed by at least one processor, this processor may then be configured to perform a particular function corresponding to the commands. The computer-readable storage medium may be, for example, the memory. At least some of the program modules may be implemented (e.g., executed) by, for example, the processor. At least some of the program modules may include, for example, a module, a program, a routine, a set of instructions, and/or a process for performing one or more functions.

The non-transitory computer-readable recording medium may include magnetic media such as a hard disk, a floppy disk, and a magnetic tape, optical media such as a compact disc-ROM (CD-ROM) and a DVD, magneto-optical media such as a floptical disk, and hardware devices specially configured to store and perform a program instruction. In addition, the program instructions may include high class language codes, which can be executed in a computer by using an interpreter, as well as machine codes made by a compiler. The aforementioned hardware device may be configured to operate as one or more software modules in order to perform the operation of various embodiments of this disclosure, and vice versa.

A module or programming module according to various embodiments may include or exclude at least one of the above-discussed elements or further include other elements or combinations thereof. The operations performed by the module, programming module or any other element according to various embodiments may be executed sequentially, in parallel, repeatedly, or by a heuristic method. Additionally, some operations may be executed in different orders or omitted, or other operations may be added.

According to certain embodiments of the present disclosure, an electronic device can prevent spring back phenomenon occurring in a flexible display by using a window at least partly enclosing the flexible display. According to certain embodiments of the present disclosure, the electronic device can prevent foreign material from entering into the periphery of the flexible display when the window partially encloses the flexible display. According to certain embodiments of the present disclosure, in the electronic device, when the window encloses the display, the corresponding bezel region may be minimized.

Although embodiments of the present disclosure have been described in detail hereinabove, it should be clearly understood that many variations and modifications of the basic inventive concepts herein described, which may appear to those skilled in the art, will still fall within the spirit and scope of the embodiments of the present disclosure as defined in the appended claims.

What is claimed is:

1. A portable communication device comprising:
   a housing;
   a flexible display accommodated in the housing, the flexible display including a front surface, a side surface extended from and at least partially angled with respect to the front surface, and a rear surface extended from and at least partially angled with respect to the side surface;
   a window covering the flexible display, the window including a first portion covering the front surface, a second portion extended from the first portion and covering the side surface, and a third portion extended from the second portion and covering a portion of the rear surface; and
   a display support member disposed under the flexible display such that the third portion of the window is at least partially disposed under the display support member,
   wherein a first part of the display support member under which the third portion of the window is disposed has a first thickness, and a second part of the display support member extended from the first part has a second thickness thicker than the first thickness, and
   wherein a thickness of the third portion of the window is thinner than a difference between the first thickness and the second thickness of the display support member.

2. The portable communication device of claim 1, wherein the window is adhered to the display support member via an adhesive member composed of an elastic rubber or tape.

3. The portable communication device of claim 1, wherein the third portion of the window includes an opening formed therein, wherein the display support member includes a fixing member, and wherein the window is disposed such that the fixing member is protruded through the opening.

4. The portable communication device of claim 1, further comprising:
   a support member disposed under the third portion of the window and the second part of the display support member such that a filling member is filled in at least part of a space between the third portion of the window and a corresponding portion of the support member.

5. The portable communication device of claim 4, wherein an elasticity of the filling member is different from that of the window.

6. The portable communication device of claim 1, wherein the second portion of the window covers the side surface of the flexible display and a side surface of the display support member.

7. The portable communication device of claim 1, further comprising:
a display support member disposed under the flexible display such that the third portion of the window is at least partially disposed between the flexible display and the display support member.

8. The portable communication device of claim 1, further comprising:
an elastic member disposed between the side surface of the flexible display and the second portion of the window.

9. A portable communication device, comprising:
a housing including a bezel region; and
a flexible display, the flexible display further comprising:
    a display panel including a front surface, a side surface extended from and at least partially angled with respect to the front surface, and a rear surface extended from and at least partially angled with respect to the side surface; and
    a window forming an outer surface of the flexible display, the window including a first portion covering the front surface of the display pane,
wherein the bezel region of the housing further comprises a step, and the first portion of the window extends along the front surface of the flexible display past the side surface of the flexible display and meets the step,
wherein the step is higher than an outer surface of the flexible display when the flexible display is mounted on the housing, and
wherein the window is attached to the housing at the bezel region.

10. The portable communication device of claim 9, wherein the window further comprises a second portion inwardly extended and disposed under the rear surface of the display panel.

11. The portable communication device of claim 10, further comprising:
a display support member disposed under the flexible display such that the second portion of the window is at least partially disposed between the flexible display and the display support member.

12. The portable communication device of claim 9, wherein the bezel region of the housing further comprises an outer portion member which creates a recess configured to accommodate the flexible display.

13. The portable communication device of claim 12, wherein the outer portion member is adhered to the window via an adhesive member composed of an elastic rubber or tape.

14. The portable communication device of claim 9, wherein a portion of the housing other than the step is adhered to the window via an adhesive member.

15. The portable communication device of claim 9, wherein the bezel region of the housing is disposed at a side portion of the housing and further comprises a step, and
wherein the first portion of the window extends along the front surface of the display panel past the side surface of the display panel and meets the step, such that the window at least partially overlaps the side portion of the housing.

16. The portable communication device of claim 15, wherein the step is higher than the outer surface of the flexible display when the flexible display is mounted on the housing.

* * * * *